(12) United States Patent
Takahashi et al.

(10) Patent No.: US 11,817,698 B2
(45) Date of Patent: Nov. 14, 2023

(54) BATTERY MANAGEMENT CIRCUIT, POWER STORAGE DEVICE, AND ELECTRIC DEVICE

(71) Applicant: SEMICONDUCTOR ENERGY LABORATORY CO., LTD., Atsugi (JP)

(72) Inventors: Kei Takahashi, Kanagawa (JP); Koji Kusunoki, Kanagawa (JP); Kouhei Toyotaka, Kanagawa (JP); Kazunori Watanabe, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 488 days.

(21) Appl. No.: 17/256,667

(22) PCT Filed: Jun. 25, 2019

(86) PCT No.: PCT/IB2019/055319
§ 371 (c)(1),
(2) Date: Dec. 29, 2020

(87) PCT Pub. No.: WO2020/008297
PCT Pub. Date: Jan. 9, 2020

(65) Prior Publication Data
US 2021/0376646 A1    Dec. 2, 2021

(30) Foreign Application Priority Data
Jul. 6, 2018   (JP) .................................. 2018-128702

(51) Int. Cl.
*H02J 7/00*      (2006.01)
*G01R 31/396*    (2019.01)
(Continued)

(52) U.S. Cl.
CPC .... *H02J 7/007182* (2020.01); *G01R 31/3835* (2019.01); *G01R 31/396* (2019.01); *H02J 7/0048* (2020.01); *H01L 29/7869* (2013.01)

(58) Field of Classification Search
CPC ...... H02J 7/00; H02J 7/007182; H02J 7/0048; G01R 31/396; G01R 31/3835; H01L 29/7869; H01L 29/786
See application file for complete search history.

(56) References Cited

U.S. PATENT DOCUMENTS 7,221,192 B1   5/2007  Talbot
7,365,528 B2   4/2008  Kawamura
(Continued)

FOREIGN PATENT DOCUMENTS

CN    102918412 A    2/2013
EP    3514557 A      7/2019
(Continued)

OTHER PUBLICATIONS

International Search Report (Application No. PCT/IB2019/055319) dated Sep. 10, 2019.
(Continued)

*Primary Examiner* — Robert L Deberadinis
(74) *Attorney, Agent, or Firm* — NIXON PEABODY LLP; Jeffrey L. Costellia

(57) ABSTRACT

A battery management circuit with a novel structure and a power storage device including the battery management circuit are provided. The power storage device includes a plurality of battery cells connected in series and a battery management circuit. The battery management circuit includes a voltage monitor circuit having a function of acquiring a voltage value between a pair of electrodes of any one of the battery cells. The voltage monitor circuit includes a multiplexer and a buffer circuit for outputting a signal for (Continued)

controlling the multiplexer. The multiplexer and the buffer circuit each include an n-channel transistor. The n-channel transistor is a transistor including an oxide semiconductor in a channel formation region. The multiplexer has a function of retaining an output voltage of the battery cell by setting the transistor in an off state.

7 Claims, 18 Drawing Sheets

(51) Int. Cl.
  *G01R 31/3835* (2019.01)
  *H01L 29/786* (2006.01)

(56) References Cited

U.S. PATENT DOCUMENTS

| | | |
|---|---|---|
| 7,863,904 B2 | 1/2011 | Takeda et al. |
| 9,250,298 B2 | 2/2016 | Canclini et al. |
| 9,356,453 B2 | 5/2016 | Kudo et al. |
| 9,543,773 B2 | 1/2017 | Momo et al. |
| 9,742,356 B2 | 8/2017 | Takahashi et al. |
| 9,840,151 B2 | 12/2017 | Momo et al. |
| 9,853,463 B2 | 12/2017 | Kudo et al. |
| 10,560,056 B2 | 2/2020 | Takahashi et al. |
| 2007/0078616 A1 | 4/2007 | Kawamura |
| 2007/0202371 A1 | 8/2007 | Takeda et al. |
| 2011/0291485 A1 | 12/2011 | Canclini et al. |
| 2014/0184172 A1 | 7/2014 | Momo et al. |
| 2020/0177132 A1 | 6/2020 | Takahashi et al. |
| 2020/0292619 A1 | 9/2020 | Tohara et al. |

FOREIGN PATENT DOCUMENTS

| | | |
|---|---|---|
| JP | 2007-101317 A | 4/2007 |
| JP | 2007-232417 A | 9/2007 |
| JP | 2013-534618 | 9/2013 |
| JP | 2014-143185 A | 8/2014 |
| JP | 2015-023698 A | 2/2015 |
| WO | WO-2011/153161 | 12/2011 |
| WO | WO-2013/094015 | 6/2013 |
| WO | WO-2018/051442 | 3/2018 |

OTHER PUBLICATIONS

Written Opinion (Application No. PCT/IB2019/055319) dated Sep. 10, 2019.

BATTERY MANAGEMENT CIRCUIT, POWER STORAGE DEVICE, AND ELECTRIC DEVICE

TECHNICAL FIELD

One embodiment of the present invention relates to a battery management circuit, a power storage device, and an electric device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electric devices to automobiles. As the application range of batteries expands, the number of applications each with a multi-cell battery stack where a plurality of battery cells are connected in series increases.

A power storage device usually includes a battery management circuit (Battery Management Unit: BMU) to monitor a state of charge (SOC). The BMU acquires data on a voltage, a current, or the like to sense abnormality during charging and discharging. The BMU stops charging and discharging and controls cell balancing or the like on the basis of observation data.

Patent Document 1 discloses a structure of a BMU that includes a multiplexer connected to a plurality of battery cells and a logic portion for controlling the multiplexer.

PRIOR ART DOCUMENT

Patent Document

[Patent Document 1] International Publication No. WO2013/094015

SUMMARY OF THE INVENTION

Problems to be Solved by the Invention

In the case where an FET switch formed using a transistor including silicon in a channel formation region (a Si transistor) is used in a multiplexer for sampling the voltage of a battery cell, there is a problem in that characteristics significantly vary when temperature rises. In particular, when a BMU is exposed in a high-temperature environment due to charging and discharging or the like of the battery cell, characteristics of a transistor included in the BMU significantly vary. In that case, problems such as an increased leakage current through the transistor and the difficulty of normal operation due to variations in transistor characteristics might occur.

An object of one embodiment of the present invention is to provide a novel battery control circuit, a novel power storage device, a novel electric device, and the like. Another object of one embodiment of the present invention is to provide a battery management circuit, a power storage device, an electric device, and the like each with a novel structure where a switch with a small variation in characteristics at the time of temperature rise is included.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted from the description by those skilled in the art. Note that one embodiment of the present invention is to solve at least one of the objects listed above and/or the other objects.

Means for Solving the Problems

One embodiment of the present invention is a battery management circuit of a battery cell. The battery management circuit includes a voltage monitor circuit. The voltage monitor circuit includes a multiplexer and a buffer circuit for outputting a signal for controlling the multiplexer. The multiplexer and the buffer circuit each include an n-channel transistor. The n-channel transistor is composed of a transistor including an oxide semiconductor in a channel formation region.

In the battery management circuit in one embodiment of the present invention, the multiplexer preferably has a function of retaining an output voltage of the battery cell by setting the transistor in an off state.

The battery management circuit in one embodiment of the present invention is preferably a battery management circuit including an arithmetic processing circuit for performing arithmetic processing utilizing a Kalman filter.

One embodiment of the present invention is a power storage device that includes a plurality of battery cells connected in series and a battery management circuit. The battery management circuit includes a voltage monitor circuit having a function of acquiring a voltage value between a pair of electrodes of any one of the battery cells. The voltage monitor circuit includes a multiplexer and a buffer circuit for outputting a signal for controlling the multiplexer. The multiplexer and the buffer circuit each include an n-channel transistor. The n-channel transistor is composed of a transistor including an oxide semiconductor in a channel formation region.

In the power storage device in one embodiment of the present invention, the multiplexer preferably has a function of retaining an output voltage of the battery cell by setting the transistor in an off state.

In the power storage device in one embodiment of the present invention, the battery management circuit preferably includes an arithmetic processing circuit for performing arithmetic processing utilizing a Kalman filter.

One embodiment of the present invention is an electric device including the power storage device and a display portion.

Note that other embodiments of the present invention will be shown in the embodiments described below and the drawings.

Effect of the Invention

One embodiment of the present invention can provide a novel battery control circuit, a novel power storage device, a novel electric device, and the like. Another embodiment of the present invention can provide a battery management circuit, a power storage device, an electric device, and the like each with a novel structure where a switch with a small variation in characteristics at the time of temperature rise is included.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1:
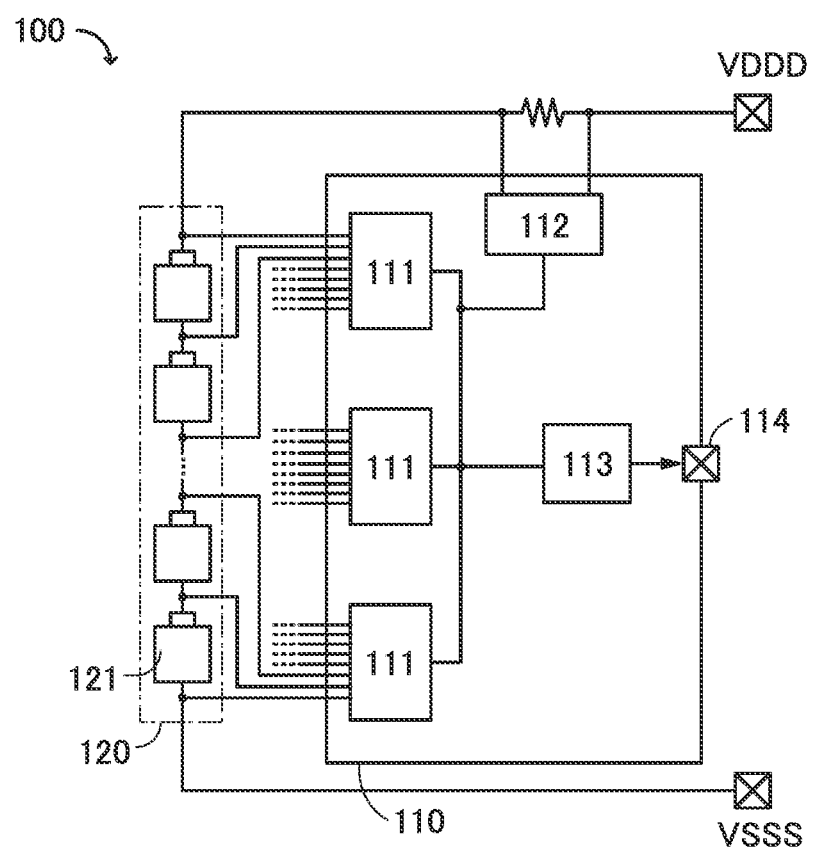
FIG. 1 is a block diagram illustrating one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

Structures of a battery management circuit and a power storage device including the battery management circuit will be described with reference to FIG. 1 to FIG. 5.

FIG. 1 illustrates an example of a block diagram of a power storage device 100. The power storage device 100 illustrated in FIG. 1 includes a battery management circuit 110, an assembled battery cell 120 including a plurality of battery cells 121, voltage monitor circuits 111, a current monitor circuit 112, and an arithmetic unit 113.

Although FIG. 1 illustrates a structure where a plurality of voltage monitor circuits 111 are provided, the number of voltage monitor circuits 111 may be either one or more. The voltage monitor circuit 111 is a circuit for observing the voltages (monitor voltages) of the battery cells 121. The voltage monitor circuit 111 has functions of sampling and retaining the voltages of the battery cells 121 and then outputting the voltages to the arithmetic unit 113.

In addition, although FIG. 1 illustrates the power storage device 100 that includes a set of the assembled battery cell 120 and the battery management circuit 110, the power storage device 100 may be a power storage device that includes a plurality of assembled battery cells 120 and a plurality of battery management circuits 110. Furthermore, the battery cell 121 is described as a lithium-ion secondary battery; however, the battery cell 121 is not limited to a lithium-ion secondary battery, and a material containing an element A, an element X, and oxygen can be used as a positive electrode material for a secondary battery, for example. The element A is one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. Moreover, the element X is one or more selected from cobalt, nickel, manganese, iron, and vanadium. Typical examples include lithium-cobalt composite oxide ($LiCoO_2$) and lithium iron phosphate ($LiFePO_4$).

The current monitor circuit 112 is a circuit for monitoring a current (monitor current) flowing through a wiring to which a voltage (VDDD-VSSS) for charging the assembled battery cell 120 is applied. Although FIG. 1 illustrates a structure where the current monitor circuit 112 is connected to both ends of a resistor to observe a current flowing through the resistor, another structure may be employed.

The arithmetic unit 113 is a circuit that performs arithmetic processing for estimating the state of each battery cell 121 in the assembled battery cell 120 on the basis of the monitor voltage obtained in the voltage monitor circuit 111 and the monitor current obtained in the current monitor circuit 112. A signal including an arithmetic result of the arithmetic processing is transmitted to a host control device through a terminal 114. Note that a signal output from the voltage monitor circuit 112 to the arithmetic unit 113 may be a signal having an analog value or may be a signal converted into a digital value.

Arithmetic operation for calculating a charge rate using a regression model based on data on the monitor voltage, the monitor current, or the like is suitable for an arithmetic operation means for estimating the state of the battery cell 121. As the regression model, a Kalman filter based on the equation of state is preferable.

A Kalman filter is a kind of infinite impulse response filter. In addition, multiple regression analysis is multivariate analysis and uses a plurality of independent variables in regression analysis. Examples of the multiple regression analysis include a least-squares method. The regression analysis requires a large number of observation values of time series, whereas the Kalman filter has an advantage of being able to obtain an optimal correction coefficient successively as long as there is accumulation of data to some extent. Moreover, the Kalman filter can also be applied to transient time series.

As a method for estimating the internal resistance and SOC (State Of Charge) of the secondary battery, a non-linear Kalman filter (specifically, an unscented Kalman filter (also referred to as UKF)) can be used. In addition, an extended Kalman filter (also referred to as EKF) can also be used.

In one embodiment of the present invention, transistors included in a multiplexer and a buffer circuit in the voltage monitor circuit 111 preferably form circuits having single polarity, and it is particularly preferable to use transistors each including an oxide semiconductor in a channel formation region (hereinafter also referred to as OS transistors). When the circuits in the voltage monitor circuit 111 are circuits formed using transistors having single polarity (circuits having single polarity), the number of photomasks at the time of transistor manufacture can be reduced, and the battery management circuit can be manufactured at low cost. Note that the circuit having single polarity is a circuit formed using n-channel transistors or p-channel transistors.

In the structure of one embodiment of the present invention, a structure of using a multiplexer and a buffer circuit each including an OS transistor enables retention of the monitor voltage in a sampling circuit in the multiplexer by utilizing an extremely low leakage current (hereinafter off-state current) flowing between a source and a drain in an off state. Thus, the structure enables highly accurate acquisition of the monitor voltage, which allows more precise estimation of the state of the battery cell.

In addition, the voltage monitor circuit using an OS transistor can rewrite and read the monitor voltage by charging or discharging electric charge; thus, a substantially unlimited number of times of acquisition and reading of the monitor voltage is possible. Unlike a magnetic memory, a resistive random access memory, or the like, the voltage monitor circuit using an OS transistor has no change in the structure at the atomic level and thus exhibits high rewrite endurance. Furthermore, unlike a flash memory, the voltage monitor circuit using an OS transistor does not show instability due to an increase of electron trap centers even when rewrite operations are repeated.

In addition, the voltage monitor circuit using an OS transistor can be freely placed, for example, over a circuit using a Si transistor and thus integration can be facilitated. Furthermore, OS transistors can be manufactured using a manufacturing apparatus similar to that for Si transistors and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain depending on a voltage applied to the gate electrode or the back gate electrode. Therefore, it is possible to design circuits under the same thought as LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Next, a specific example of the assembled battery cell 120 is shown, and then a structure example of the voltage monitor circuit 111 is described.

Figure 2A:
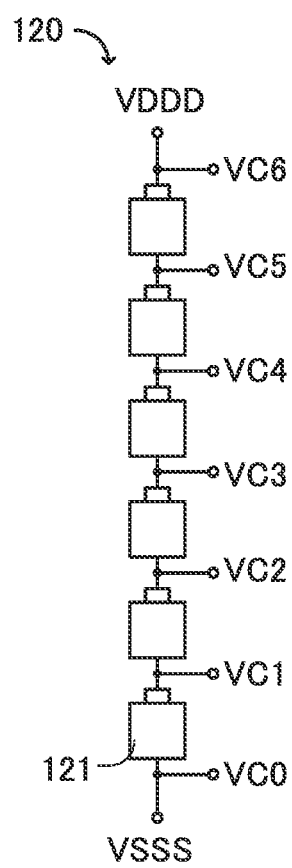
FIGS. 2(A) and 2(B) are circuit diagrams illustrating one embodiment of the present invention.

As an example of the assembled battery cell 120 described in FIG. 1, FIG. 2(A) illustrates a schematic diagram where six battery cells 121 are connected in series. FIG. 2(A) also illustrates seven terminals as terminals for acquiring the monitor voltages. The voltage monitor circuit 111 acquires voltages VC0 to VC6 from the respective terminals. The voltage monitor circuit 111 can acquire the monitor voltage from one battery cell by, for example, estimation of a difference between the voltage VC1 and the voltage VC0.

Figure 2B:
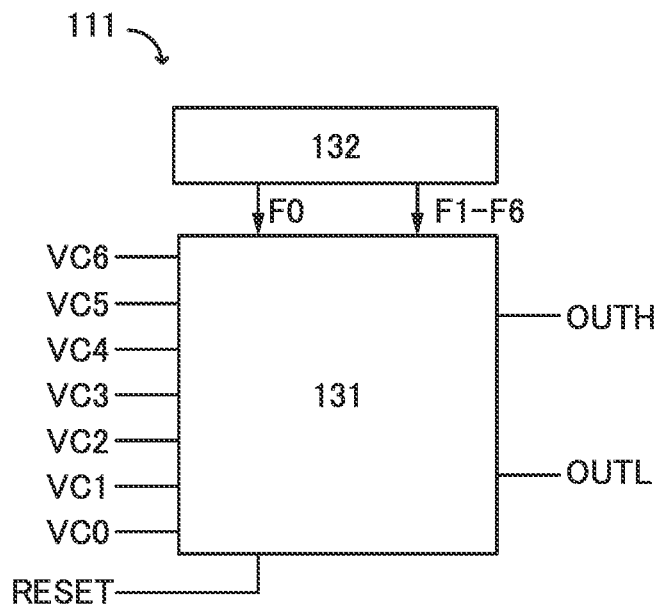

FIG. 2(B) illustrates an example of a block diagram of the voltage monitor circuit 111 described in FIG. 1. FIG. 2(B) illustrates the voltage monitor circuit 111 composed of a multiplexer 131 and a control circuit 132.

The multiplexer 131 acquires (samples) the monitor voltage of each battery cell from the voltages VC0 to VC6. A reset signal RESET is input to the multiplexer 131 so that the monitor voltages that are read as output voltages OUTH and OUTL are initialized. A control signal F0 and control signals F1 to F6 are input from the control circuit 132 to the multiplexer 131 so that sampling of the voltages VC0 to VC6 and reading of the monitor voltages are controlled. The multiplexer 131 outputs the monitor voltage of each battery cell 121 as the output voltages OUTH and OUTL.

Note that although FIG. 2(B) illustrates the structure where the control signal F0 and the control signals F1 to F6 are output from the control circuit 132, another structure may be employed. The control circuit 132 may be a component different from that of the voltage monitor circuit 111, and the control signal F0 and the control signals F1 to F6 may be output to the multiplexer 131 from the component different from the voltage monitor circuit 111.

The multiplexer 131 includes a switch for sampling a monitor voltage and a switch for reading the sampled monitor voltage. The multiplexer 131 may include a buffer circuit that amplifies current supply capabilities for the control signal F0 and the control signals F1 to F6 for driving the switches. In addition, the buffer circuit may serve as a level shifter having a function of boosting the voltage levels of the control signal F0 and the control signals F1 to F6 that are input.

The reset signal RESET is a signal for initializing the output voltages OUTH and OUTL. The control signal F0 is a signal for sampling a voltage from the battery cell 121 and retaining the sampled voltage in a capacitor in the multiplexer 131. Any one of the control signals F1 to F6 is a signal for selecting and outputting any one of the monitor voltages of the six battery cells.

Figure 3:
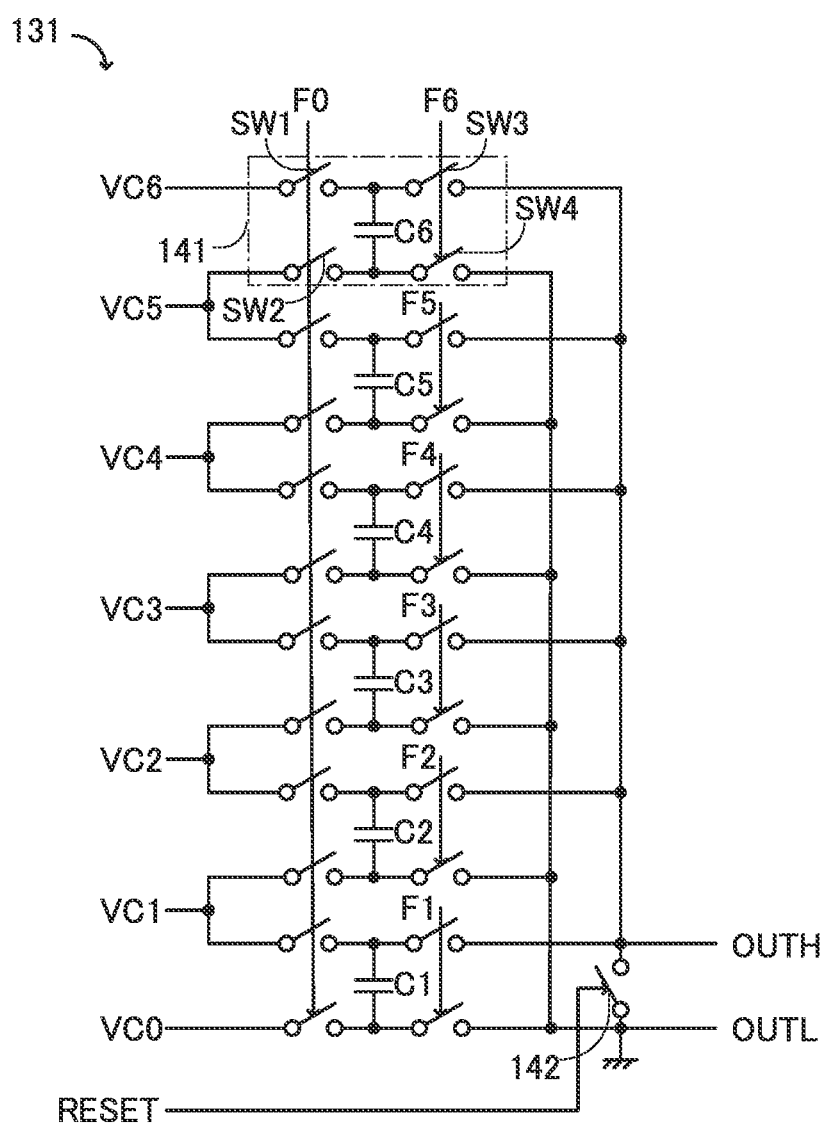
FIG. 3 is a circuit diagram illustrating one embodiment of the present invention.

FIG. 3 is an example of a circuit configuration of the multiplexer 131 described in FIG. 2(B).

The multiplexer 131 illustrated in FIG. 3 includes sampling circuits 141 and a switch 142. A plurality of sampling circuits 141 are provided and connected to terminals to which the voltages VC0 to VC6 are applied. The sampling circuit 141 retains and selectively outputs a voltage difference between two points. The example in FIG. 3 illustrates six sampling circuits for acquiring monitor voltages of six battery cells.

The sampling circuit 141 includes a plurality of switches SW1 to SW4 and any one of capacitors C1 to C6 (also denoted by C[N]).

The on or off of each of the switches SW1 and SW2 is controlled by the control signal F0. When the switches SW1 and SW2 in each sampling circuit 141 are simultaneously turned on by the control signal F0, the monitor voltages of the battery cells are acquired from the terminals connected to the voltages VC0 to VC6. When the switches SW1 and SW2 in each sampling circuit 141 are simultaneously turned off by the control signal F0, monitor voltages obtained by sampling from the respective battery cells are retained in the capacitors C1 to C6.

The on or off of each of the switches SW3 and SW4 is controlled by any one of the control signals F1 to F6. When the switches SW3 and SW4 in each sampling circuit 141 are selected and turned on by the control signals F1 to F6, voltages retained in the capacitors C1 to C6 of the sampling circuit 141 can be sequentially output as the output voltages OUTH and OUTL. When the switches SW3 and SW4 in each sampling circuit 141 are selected and turned off by the control signals F1 to F6, monitor voltages obtained by sampling from the respective battery cells are retained in the capacitors C1 to C6.

The switch 142 is a switch for turning on a portion between wirings for applying the output voltages OUTH and OUTL to initialize a voltage between the wirings. The on or off of the switch 142 is controlled by control of the reset signal RESET. It is suitable for the wiring for applying the output voltage OUTL to be connected to a reference potential, for example, a ground potential.

Figure 4A:
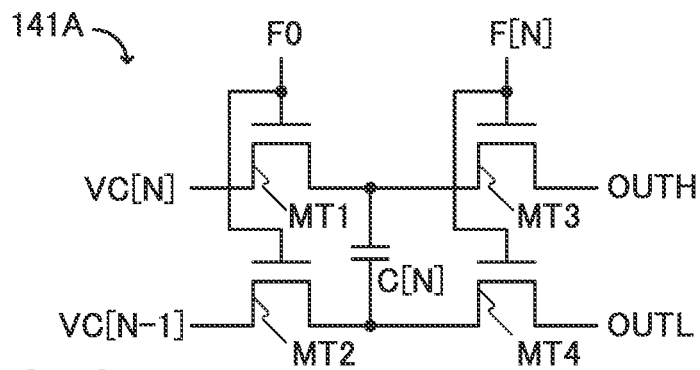
FIGS. 4(A) to 4(C) are circuit diagrams each illustrating one embodiment of the present invention.
Figure 4B:
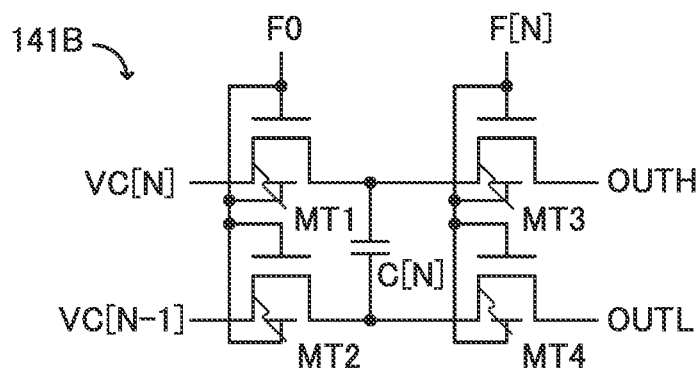
Figure 4C:
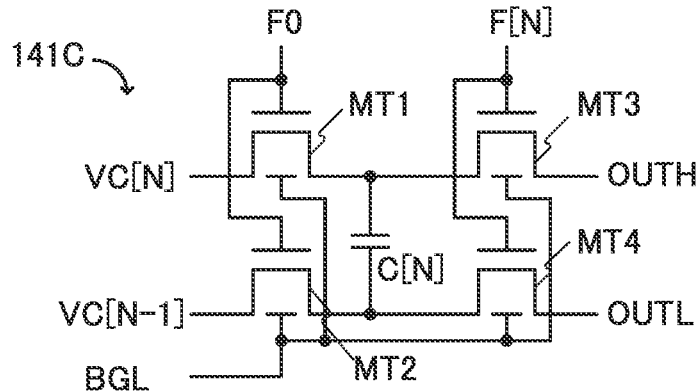

FIGS. 4(A) to 4(C) are diagrams illustrating structure examples of sampling circuits 141A to 141C that can be applied to the sampling circuit 141 described in FIG. 3.

The sampling circuit 141A illustrated in FIG. 4(A) includes transistors MT1 to MT4 and the capacitor C[N]. Note that voltages VC[N] and VC[N−1] correspond to voltages of two terminals of the battery cell 121 (for example, the voltages VC1 and VC0 in FIG. 3). The transistors MT1 to MT4 have functions corresponding to those of the switches SW1 to SW4 described in FIG. 3. A control signal F[N] corresponds to a signal corresponding to any one of the control signals F1 to F6 described in FIG. 3.

As described above, OS transistors are suitable for the transistors MT1 to MT4 that are included in the sampling circuit 141A of the multiplexer 131. The off state current of an OS transistor is extremely low. Therefore, by turning off the transistors MT1 to MT4 functioning as switches, electric charge corresponding to a monitor voltage can be retained in the capacitor C[N]. In other words, by setting the transistors MT1 to MT4 to off states, the output voltage of the battery cell can be retained in the capacitor C[N].

With a structure of using a multiplexer including an OS transistor, a monitor voltage can be retained in a sampling circuit in the multiplexer owing to an extremely low off-state current. Thus, the structure enables highly accurate acquisition of the monitor voltage. As a result, an arithmetic unit can increase the estimate accuracy of a parameter value such as a charge rate.

FIG. 4(B) illustrates a structure where each of the transistors MT1 to MT4 in the structure illustrated in FIG. 4(A) includes a back gate electrode and a signal is input to each of a gate electrode and the back gate electrode. With the structure in FIG. 4(B), a voltage for controlling a channel formation region can be applied from each of the gate electrode and the back gate electrode. Thus, the on or off of the transistors MT1 to MT4 functioning as switches can be controlled more reliably.

FIG. 4(C) illustrates a structure where each of the transistors MT1 to MT4 in the structure illustrated in FIG. 4(A) includes a back gate electrode and a different potential is applied to the back gate electrode, for example, from a back gate potential line. By using a structure where a potential for controlling the threshold voltage is applied to the back gate potential line as the structure in FIG. 4(C), an off-state current in a high-temperature environment can be reduced. Thus, the on or off of the transistors MT1 to MT4 functioning as switches can be controlled even in a high-temperature environment.

Figure 5:
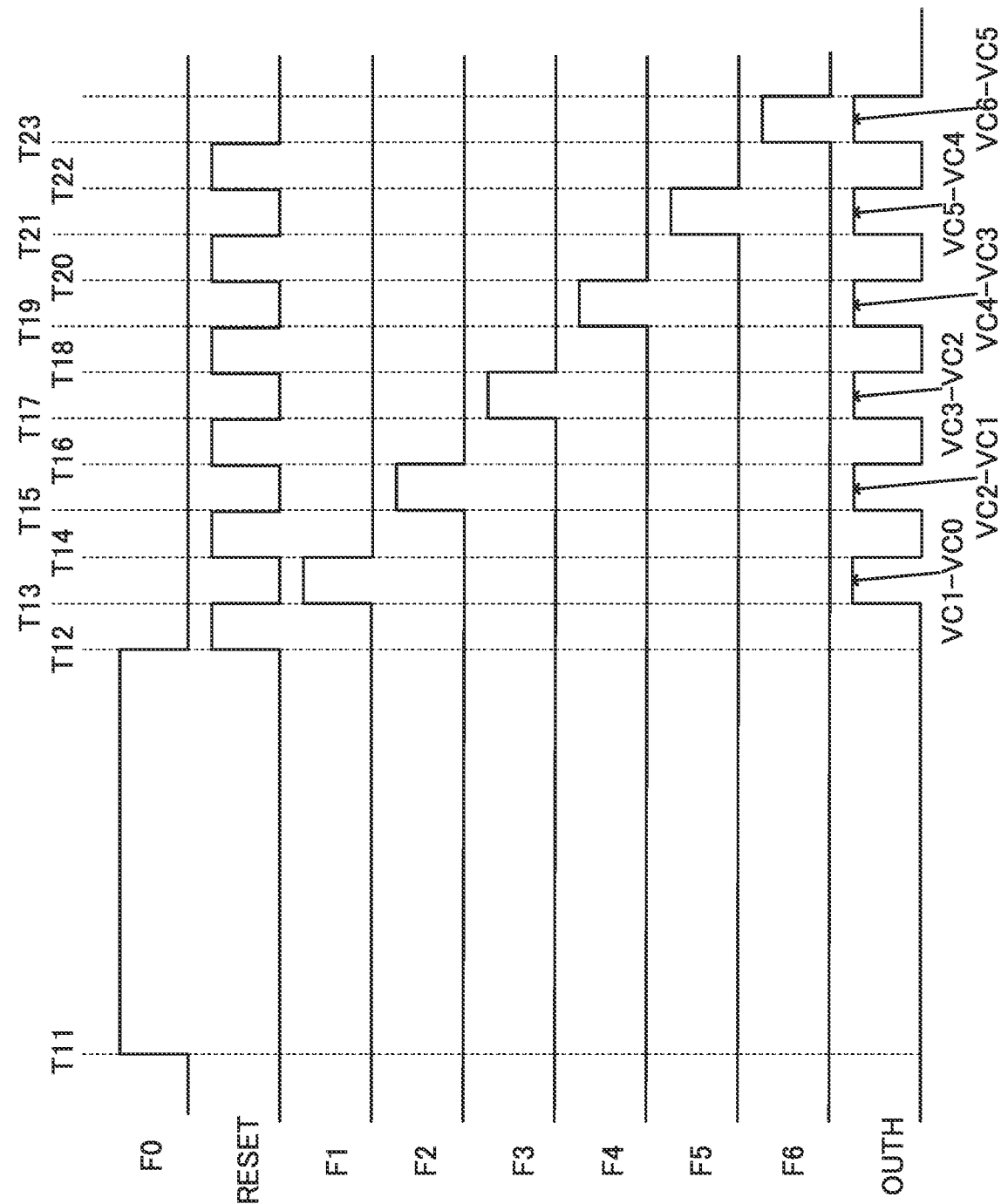
FIG. 5 is a timing chart illustrating one embodiment of the present invention.

FIG. 5 is a timing chart for showing operation when the sampling circuit 141A described in FIG. 4(A) is applied to the multiplexer 131 in FIG. 3. The timing chart in FIG. 5 shows the control signals F0 to F6, the reset signal RESET, and the output voltage OUTH that are illustrated in FIG. 3.

A control signal F0 is set to an H level from Time T11 to Time T12 to turn on the transistors MT1 to MT2. Voltages at both ends of the battery cell 121 are applied to electrodes at both ends of the capacitor C[N]. The reset signal RESET and the control signals F1 to F6 are set to an L level during this period.

The reset signal RESET is set to an H level from Time T12 to Time T13 to turn on the switch 142 and the output voltage OUTH is initialized. The control signal F0 and the control signals F1 to F6 are set to an L level during this period.

Next, the control signal F1 is set to an H level from Time T13 to Time T14 to turn on the transistors MT3 to MT4 in the sampling circuit 141 to which the control signal F1 is input. The control signal F0, the reset signal RESET, and the control signals F2 to F6 are set to an L level during this period. As a result, a monitor voltage (VC1−VC0) retained in any one of the sampling circuits from Time T11 to Time T12 can be selectively read as the output voltage OUTH.

A structure is employed in which operation of setting the reset signal RESET to an H level and operation of setting any one of the control signals F2 to F6 to an H level are repeated on and after Time T15 so that voltages (VC2−VC1), (VC3−VC2), (VC4−VC3), (VC5−VC4), and (VC6−VC5) corresponding to monitor voltages are read.

The structure of one embodiment of the present invention is a structure of using an OS transistor as a transistor included in a sampling circuit. Thus, electric charge that has been temporarily sampled and retained can be retained for a long period. Even when the whole period is divided into a period during which a voltage is sampled from the battery cell and a period during which a monitor voltage is read as shown in FIG. 5, a highly accurate monitor voltage can be obtained. The structure is effective when the number of battery cells in an assembled battery cell is increased.

Embodiment 2

In this embodiment, structures of a battery management circuit including a multiplexer having a structure different from that of the multiplexer 131 described in the above embodiment and a power storage device including the battery management circuit will be described.

Figure 6A:
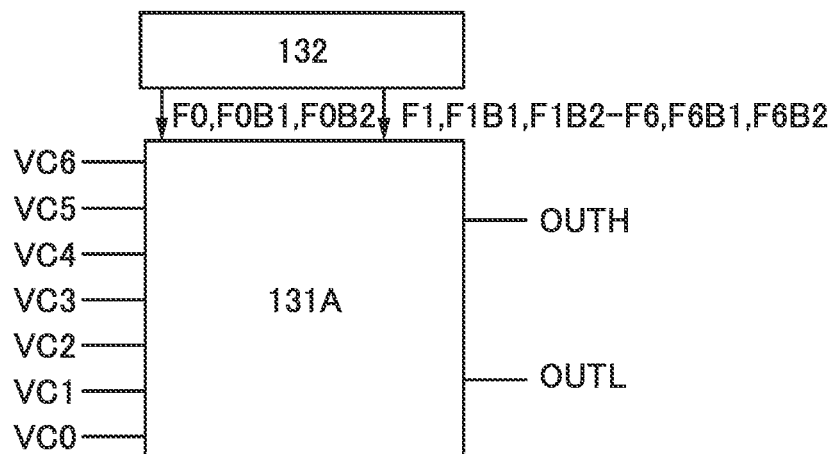
FIGS. 6(A) and 6(B) are circuit diagrams illustrating one embodiment of the present invention.
Figure 6B:
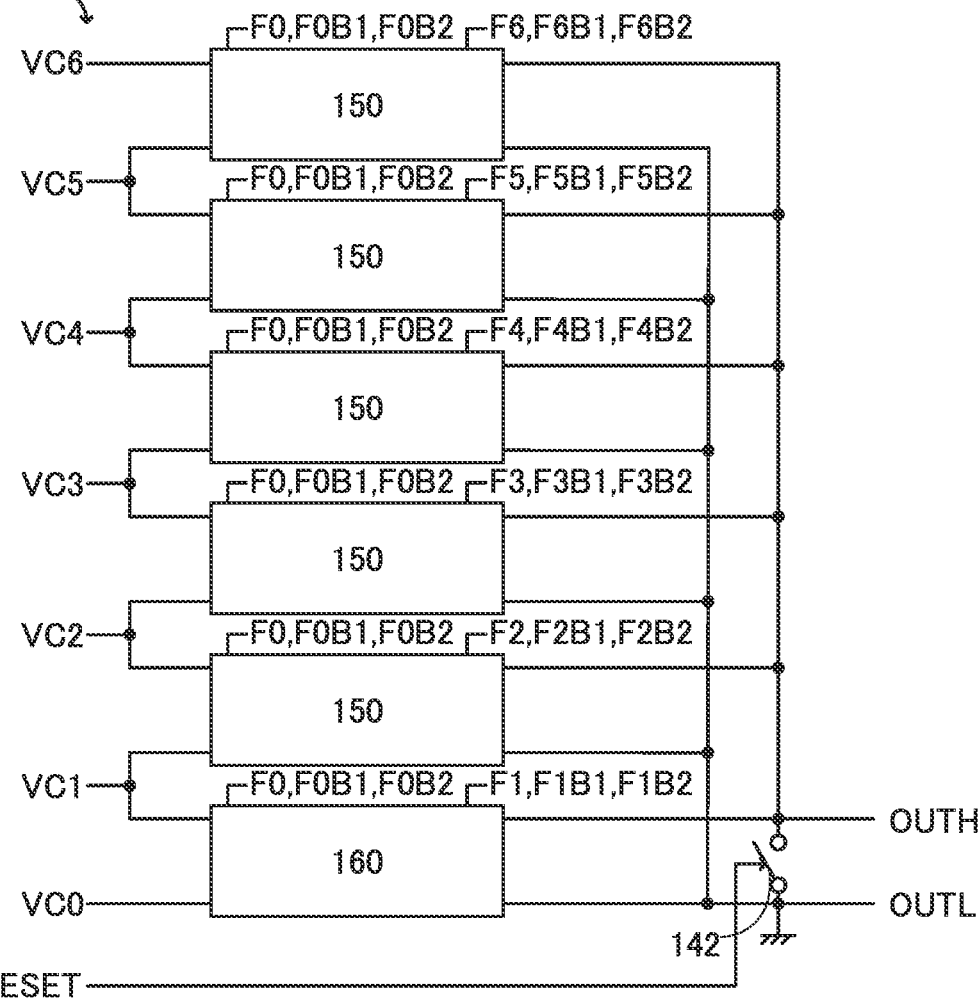

FIG. 6(A) illustrates an example of a block diagram of a voltage monitor circuit 111A that can be applied to the voltage monitor circuit 111 described in FIG. 1. FIG. 6(B) illustrates the voltage monitor circuit 111A composed of a multiplexer 131A and the control circuit 132.

The multiplexer 131A samples the monitor voltage of each battery cell from the voltages VC0 to VC6. The reset signal RESET is input to the multiplexer 131A so that the monitor voltages that are read as the output voltages OUTH and OUTL are initialized. Control signals F0, F0B1, and F0B2, and control signals F1 to F6, F1B1 to F6B1, and F1B2 to F6B2 are input from the control circuit 132 to the multiplexer 131A so that sampling of the voltages VC0 to VC6 and reading of the monitor voltages are controlled. The multiplexer 131A outputs the monitor voltage of each battery cell 121 as the output voltages OUTH and OUTL.

Note that in FIG. 6(A), the control signal F0B1 is an inverted signal of the control signal F0. In addition, the control signal F0B2 is a control signal whose timing is different from that of the control signal F0B1. Similarly, in FIG. 6(A), the control signals F1B1 to F6B1 are inverted signals of the control signals F1 to F6. Furthermore, the control signal F0B2 is the control signal whose timing is different from that of the control signal F0B1.

Note that although FIG. 6(A) illustrates the structure where the control signals F0, F0B1, and F0B2, and the control signals F1 to F6, F1B1 to F6B1, and F1B2 to F6B2 are output from the control circuit 132, another structure may be employed. The control circuit 132 may be a component different from that of the voltage monitor circuit 111A, and the control signals F0, F0B1, and F0B2, and the control signals F1 to F6, F1B1 to F6B1, and F1B2 to F6B2 may be output to the multiplexer 131A from the component different from the voltage monitor circuit 111A.

The multiplexer 131A includes a switch for sampling a monitor voltage and a switch for reading the sampled monitor voltage. The multiplexer 131A includes a buffer circuit that amplifies current supply capabilities for the control signal F0 and the control signals F1 to F6 for driving the switches. In addition, the buffer circuit can serve as a level shifter having a function of boosting the voltage levels of the control signal F0 and the control signals F1 to F6 that are input.

The reset signal RESET is the signal for initializing the output voltages OUTH and OUTL. The control signal F0 is a signal for sampling a voltage from the battery cell 121 and retaining the sampled voltage in a capacitor in the multiplexer 131A. Any one of the control signals F1 to F6 is the signal for selecting and outputting any one of the monitor voltages of six battery cells.

FIG. 6(B) is an example of a circuit configuration of the multiplexer 131A described in FIG. 6(A).

The multiplexer 131A illustrated in FIG. 6(B) includes sampling circuits 150, a sampling circuit 160, and the switch 142. A plurality of sampling circuits 150 are provided and connected to terminals to which the voltages VC1 to VC6 are applied. The sampling circuit 160 is connected to terminals to which the voltages VC1 and VC0 are applied. The sampling circuits 150 and 160 each retain and selectively output a voltage difference between two points. Note that the sampling circuit 160 retains and selectively outputs a voltage difference between two points of the battery cell on the low potential side.

Figure 7A:
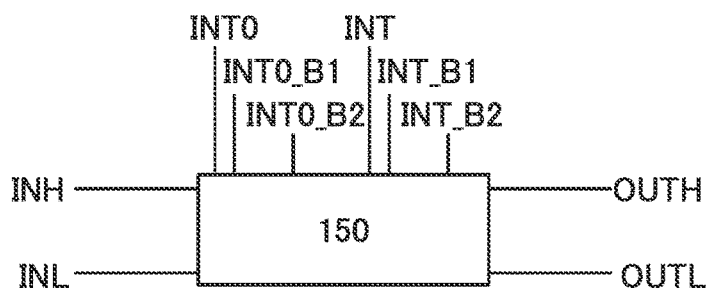
FIGS. 7(A) and 7(B) are circuit diagrams illustrating one embodiment of the present invention.
Figure 7B:
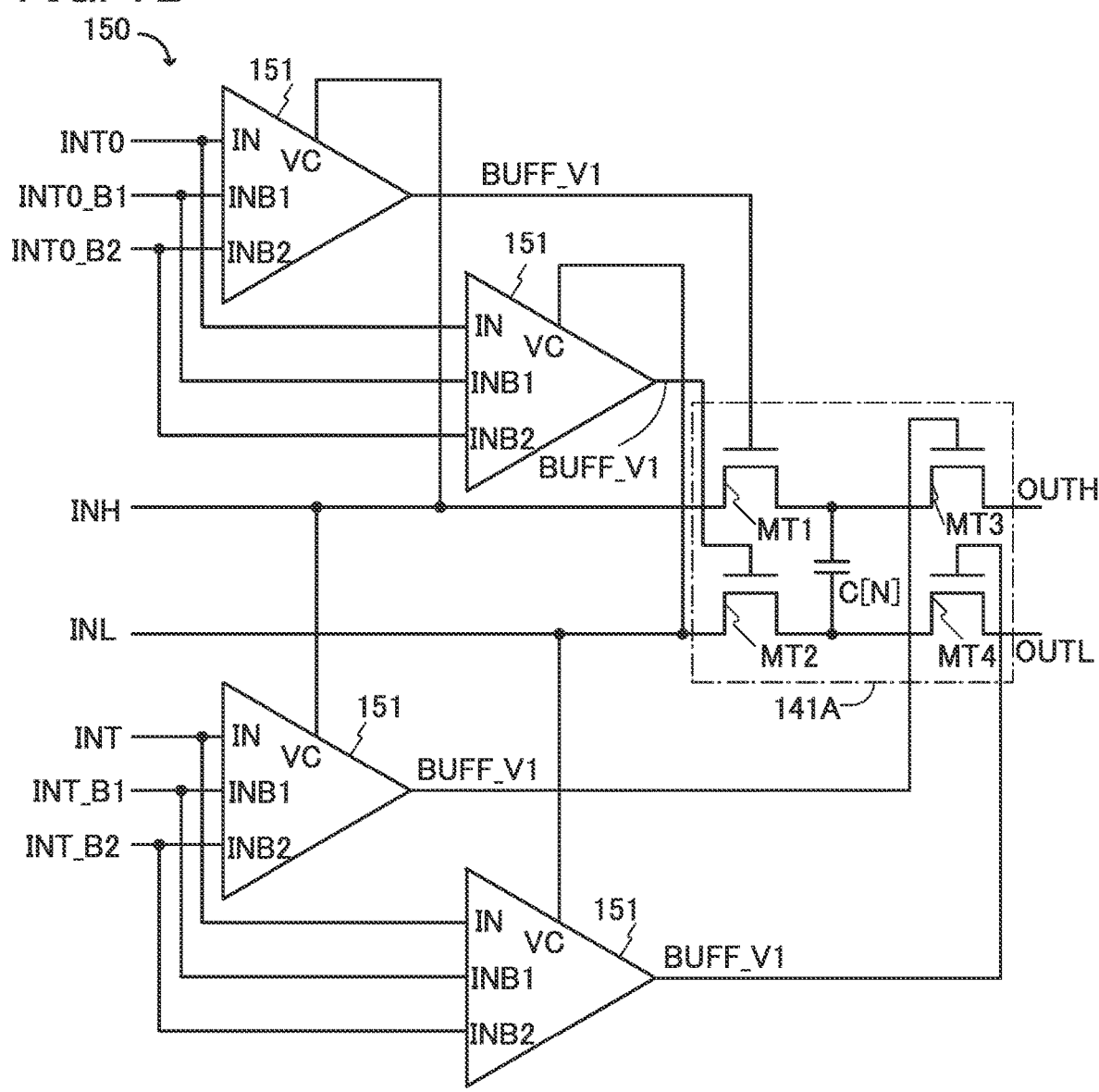
Figure 8A:
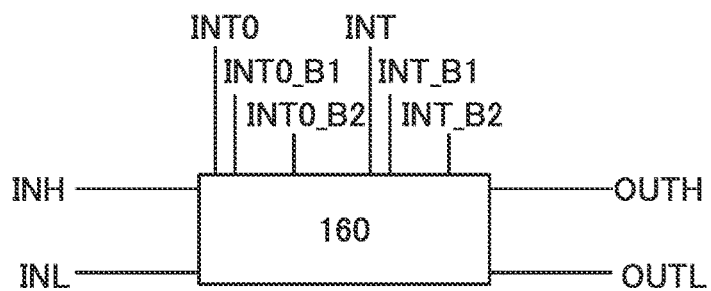
FIGS. 8(A) and 8(B) are circuit diagrams illustrating one embodiment of the present invention.
Figure 8B:
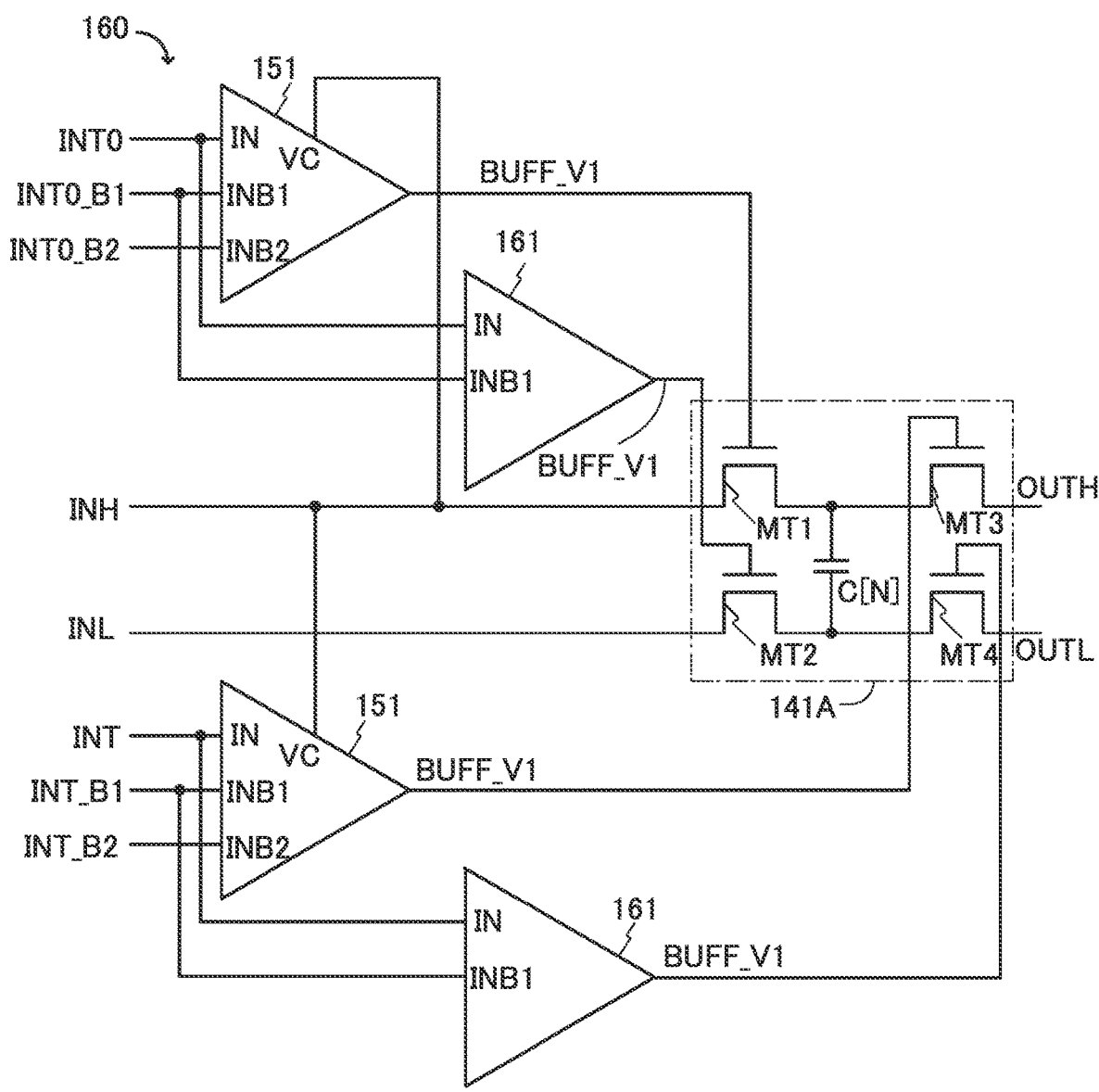

Next, structure examples of the sampling circuits 150 and 160 are described. FIGS. 7(A) and 7(B) illustrate the sampling circuit 150, and FIGS. 8(A) and 8(B) illustrate the sampling circuit 160.

FIG. 7(A) is a block diagram where symbols of the sampling circuit 150 illustrated in FIG. 6(B) are extracted. FIG. 7(A) illustrates voltages INH and INL as voltages sampled by the sampling circuit 150. In addition, FIG. 7(A) illustrates the output voltages OUTH and OUTL as output voltages of the sampling circuit 150. In FIG. 7(A), a control signal INT0, a control signal INT0_B1, a control signal INT0_B2, a control signal INT, a control signal INT_B1, and a control signal INT_B2 are illustrated as control signals input to the sampling circuit 150. The control signal INT0, the control signal INT0_B1, the control signal INT0_B2, the control signal INT, the control signal INT_B1, and the control signal INT_B2 correspond to the control signal F0, the control signal F0B1, the control signal F0B2, the control signal F6, the control signal F6B1, and the control signal F6B2 illustrated in FIG. 6(B).

FIG. 7(B) is a specific circuit configuration example of the sampling circuit 150. The sampling circuit 150 includes buffer circuits 151 in addition to the structure of the sampling circuit 141A described in FIG. 4(A) in Embodiment 1. As illustrated in FIG. 7(B), the control signal INT0, the control signal INT0_B1, the control signal INT0_B2, the control signal INT, the control signal INT_B1, the control signal INT_B2, the voltage INH, and the voltage INL are input to a plurality of buffer circuits 151. Signals BUFF_V1 output from the buffer circuits 151 are input to gates of the transistors MT1 to MT4 included in the sampling circuit 141A.

Note that in the buffer circuits 151 illustrated in FIG. 7(B), respective terminals are denoted by IN, INB1, INB2, and VC. Specific circuit configuration examples will be described in FIGS. 9(A) to 9(C).

Like FIG. 7(A), FIG. 8(A) is a block diagram where symbols of the sampling circuit 160 illustrated in FIG. 6(B) are extracted. FIG. 8(A) illustrates the voltages INH and INL as voltages sampled by the sampling circuit 160. In addition, FIG. 8(A) illustrates the output voltages OUTH and OUTL as output voltages of the sampling circuit 160. In FIG. 8(A), the control signal INT0, the control signal INT0_B1, the control signal INT0_B2, the control signal INT, the control signal INT_B1, and the control signal INT_B2 are illustrated as control signals input to the sampling circuit 160. The control signal INT0, the control signal INT0_B1, the control signal INT0_B2, the control signal INT, the control signal INT_B1, and the control signal INT_B2 correspond to the control signal F0, the control signal F0B1, the control signal F0B2, the control signal F1, the control signal F1B1, and the control signal F1B2 illustrated in FIG. 6(B).

FIG. 8(B) is a specific circuit configuration example of the sampling circuit 160. The sampling circuit 160 includes the buffer circuits 151 and buffer circuits 161 in addition to the structure of the sampling circuit 141A described in FIG. 4(A) in Embodiment 1. As illustrated in FIG. 8(B), the control signal INT0, the control signal INT0_B1, the control signal INT0_B2, the control signal INT, the control signal INT_B1, the control signal INT_B2, the voltage INH, and the voltage INL are input to a plurality of buffer circuits 151 and a plurality of buffer circuits 161. The signals BUFF_V1 output from the buffer circuit 151 and the buffer circuit 161 are input to the gates of the transistors MT1 to MT4 included in the sampling circuit 141A.

Note that in the buffer circuits 161 illustrated in FIG. 8(B), respective terminals are denoted by IN and INB1. Specific circuit configuration examples will be described in FIGS. 10(A) to 10(C).

Next, a configuration example of the buffer circuit 151 is described.

Figure 9A:
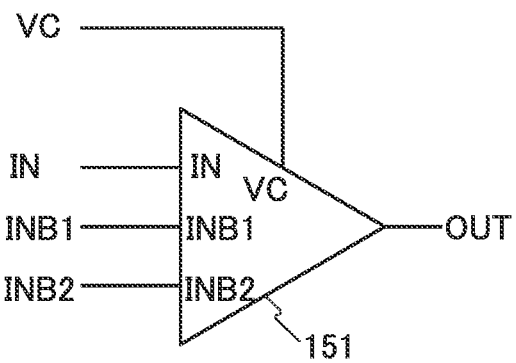
FIGS. 9(A) to 9(C) are circuit diagrams and a g chart illustrating one embodiment of the present invention.

FIG. 9(A) is a block diagram where symbols of the buffer circuit 151 illustrated in FIG. 7(B) are extracted. FIG. 9(A) illustrates IN, INB1, and INB2 as input signals and input terminals of the buffer circuit 151. FIG. 9(A) illustrates VC as a power supply voltage and a power supply voltage terminal of the buffer circuit 151. FIG. 9(A) illustrates OUT as an output signal and an output terminal of the buffer circuit 151.

Figure 9B:
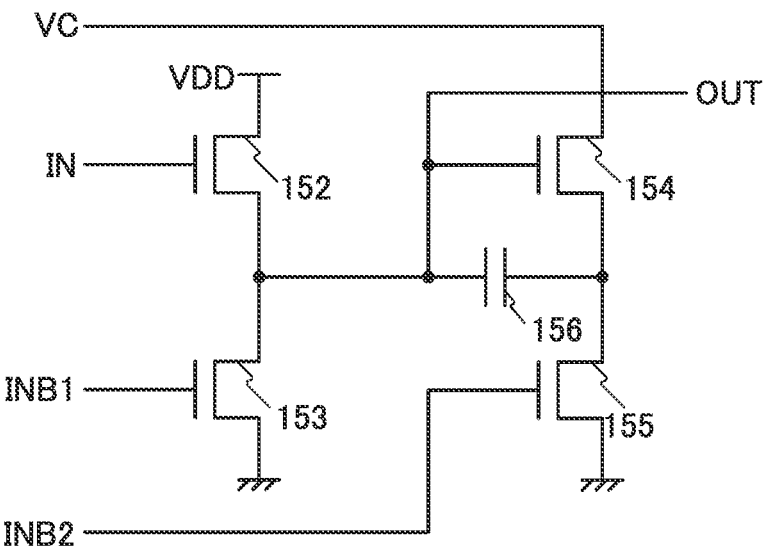

FIG. 9(B) is a diagram illustrating a specific circuit configuration example of the buffer circuit 151 illustrated in FIG. 9(A). The buffer circuit 151 includes transistors 152 to 155 and a capacitor 156. In addition, as illustrated in FIG. 9(B), the input signals IN, INB1, and INB2 and the power supply voltage VC are input to gates and sources or drains of the transistors. A power supply voltage VDD is a voltage lower than the power supply voltage VC.

Figure 9C:
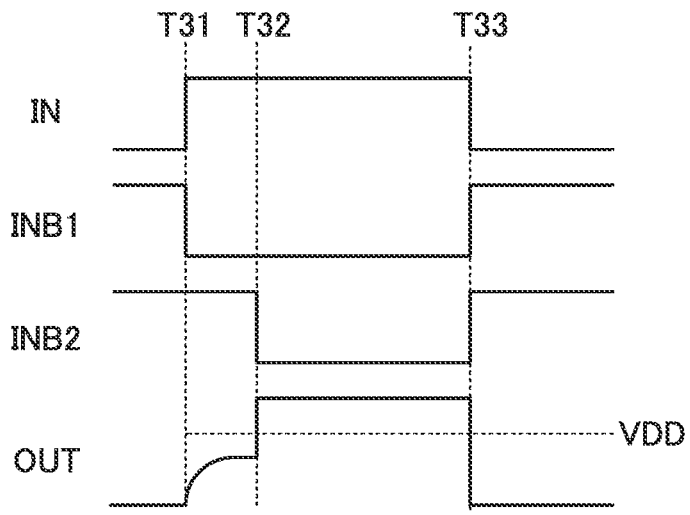

FIG. 9(C) is a timing chart for showing an operation example of the buffer circuit 151 illustrated in FIG. 9(B).

As illustrated in FIG. 9(C), for the buffer circuit 151, the input signal IN is set to an H level and the input signal INB1 is set to an L level at Time T31. The transistor 152 is turned on, and the output voltage is increased to a voltage that is lower than VDD. Switching of the input signal INB2 from an H level to an L level at Time T32 enables switching of the transistor 155 from on to off. The potential of the output signal OUT is increased by the capacitive coupling of the capacitor 156. When the input signal IN is set to an L level and the input signals INB1 and INB2 are set to an H level at Time T33, the output signal OUT is set to an L level.

With the operation in FIG. 9(C), the output signal OUT can be a signal boosted from the input signal IN in a circuit having single polarity in FIG. 9(B).

Next, a configuration example of the buffer circuit 161 is described.

Figure 10A:
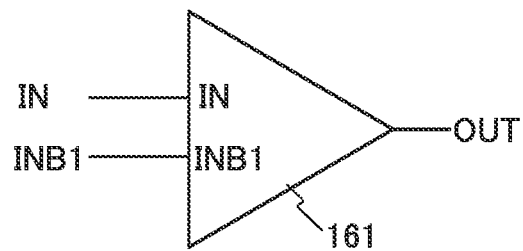
FIGS. 10(A) to 10(C) are circuit diagrams and a timing chart illustrating one embodiment of the present invention.

FIG. 10(A) is a block diagram where symbols of the buffer circuit 161 illustrated in FIG. 8(B) are extracted. FIG. 10(A) illustrates IN and INB1 as input signals and input terminals of the buffer circuit 161. FIG. 10(A) illustrates OUT as an output signal and an output terminal of the buffer circuit 161.

Figure 10B:
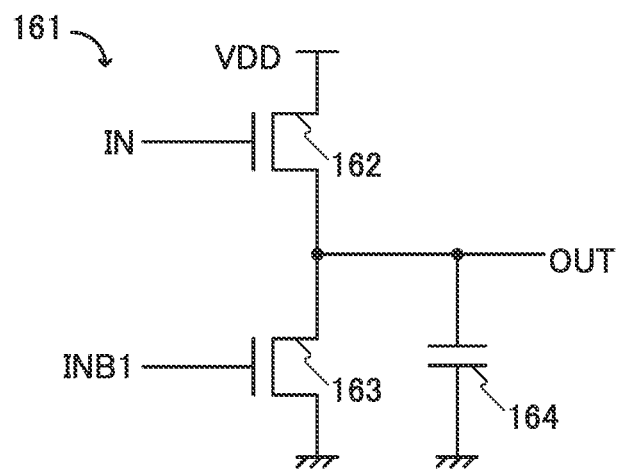

FIG. 10(B) is a diagram illustrating a specific circuit configuration example of the buffer circuit 161 illustrated in FIG. 10(A). The buffer circuit 161 includes transistors 162 to 163 and a capacitor 164. In addition, as illustrated in FIG. 10(B), the input signals IN and INB1 and the power supply voltage VDD are input to gates and sources or drains of the transistors.

Figure 10C:
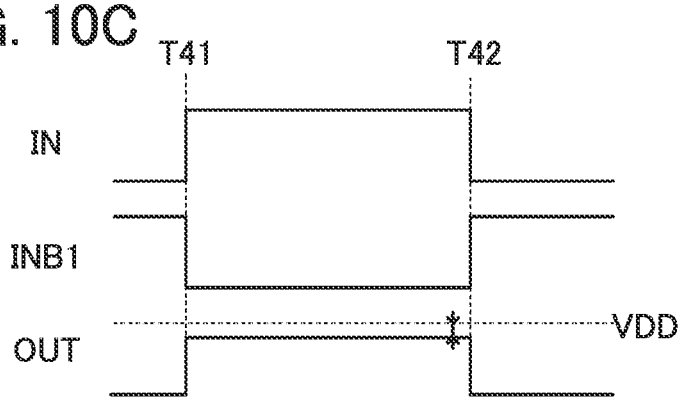

FIG. 10(C) is a timing chart for showing an operation example of the buffer circuit 161 illustrated in FIG. 10(B).

As illustrated in FIG. 10(C), for the buffer circuit 161, the input signal IN is set to an H level and the input signal INB1 is set to an L level at Time T41. The transistor 162 is turned on, the transistor 163 is turned of, and the output voltage is increased to a voltage that is lower than VDD. When the input signal IN is set to an L level and the input signal INB1 is set to an H level at Time T42, the output signal OUT is set to an L level.

With the operation in FIG. 10(C), the output signal OUT becomes a signal whose voltage is lower than that of the input signal IN by the threshold voltage of the transistor 162 in a circuit having single polarity in FIG. 10(B). Meanwhile, the potential of a battery cell to which the buffer circuit 161 is connected is low. Thus, even when the amplitude voltage of the output signal OUT of the buffer circuit 161 is low, there is no problem with the on/off operations of the transistors MT2 and MT4. With this structure, the number of transistors in the buffer circuit 161 can be made smaller than that in the buffer circuit 151.

The battery management circuit described in this embodiment and a power storage device including the ionization management circuit each have a reduction effect on the number of transistors in addition to the effects of the structures described in Embodiment 1.

Embodiment 3

In this embodiment, operation examples of the battery management circuit described in the above embodiment and a power storage device including the battery management circuit are described.

Figure 11:
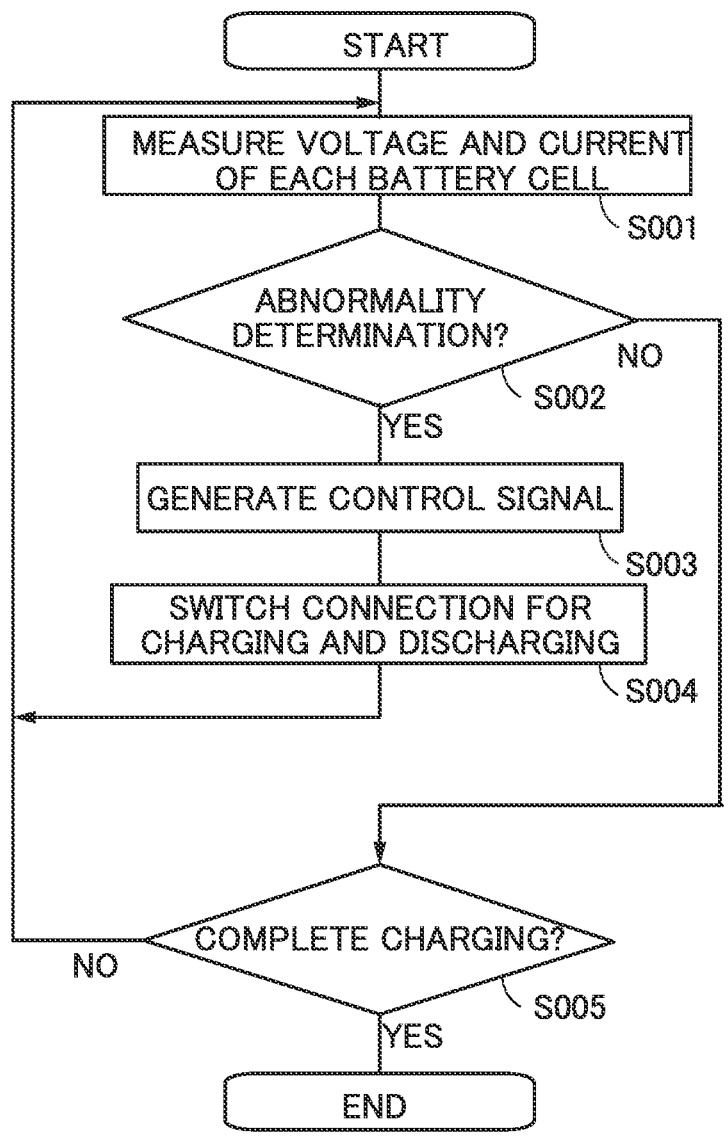
FIG. 11 is a flow chart showing one embodiment of the present invention.

FIG. 11 illustrates a flow chart for showing operation examples of the battery management circuit and a power storage device including the ionization management circuit.

As described above, the battery management circuit measures a current and a voltage of each battery cell (Step S001). The current of each battery cell is measured by acquiring monitor current data, and the voltage of each battery cell is measured by acquiring monitor voltage data.

Next, the arithmetic unit in the battery management circuit determines whether there is abnormality determination (YES or NO) on the basis of each data measured in Step S001 (Step S002). The abnormality determination is performed by sensing behavior that is different from behavior in a normal state, for example, detecting a high voltage or a large amount of current. If there is no abnormality determination, the battery management circuit goes to Step S005 to determine whether the charging is completed or not and terminates the operation when the charging is completed (YES). When the charging is not completed (NO), the battery management circuit returns to Step S001.

Then, in the case where the arithmetic unit in the battery management circuit determines that there is abnormality in Step S002, the arithmetic unit generates a control signal (Step S003).

Next, the arithmetic unit outputs a transistor control signal for controlling the on or off of a transistor for controlling charging and discharging that is provided outside through the terminal 114 or the like and switches the connection of the transistor for controlling charging and discharging (Step S004). The transistor for controlling charging and discharging is a transistor provided for a wiring for supplying a voltage and a current for charging and discharging.

Through the above operation, the battery management circuit can sense abnormality at the time of charging and discharging from a monitor voltage and a monitor current and can stop the charging and discharging.

Embodiment 4

Figure 12:
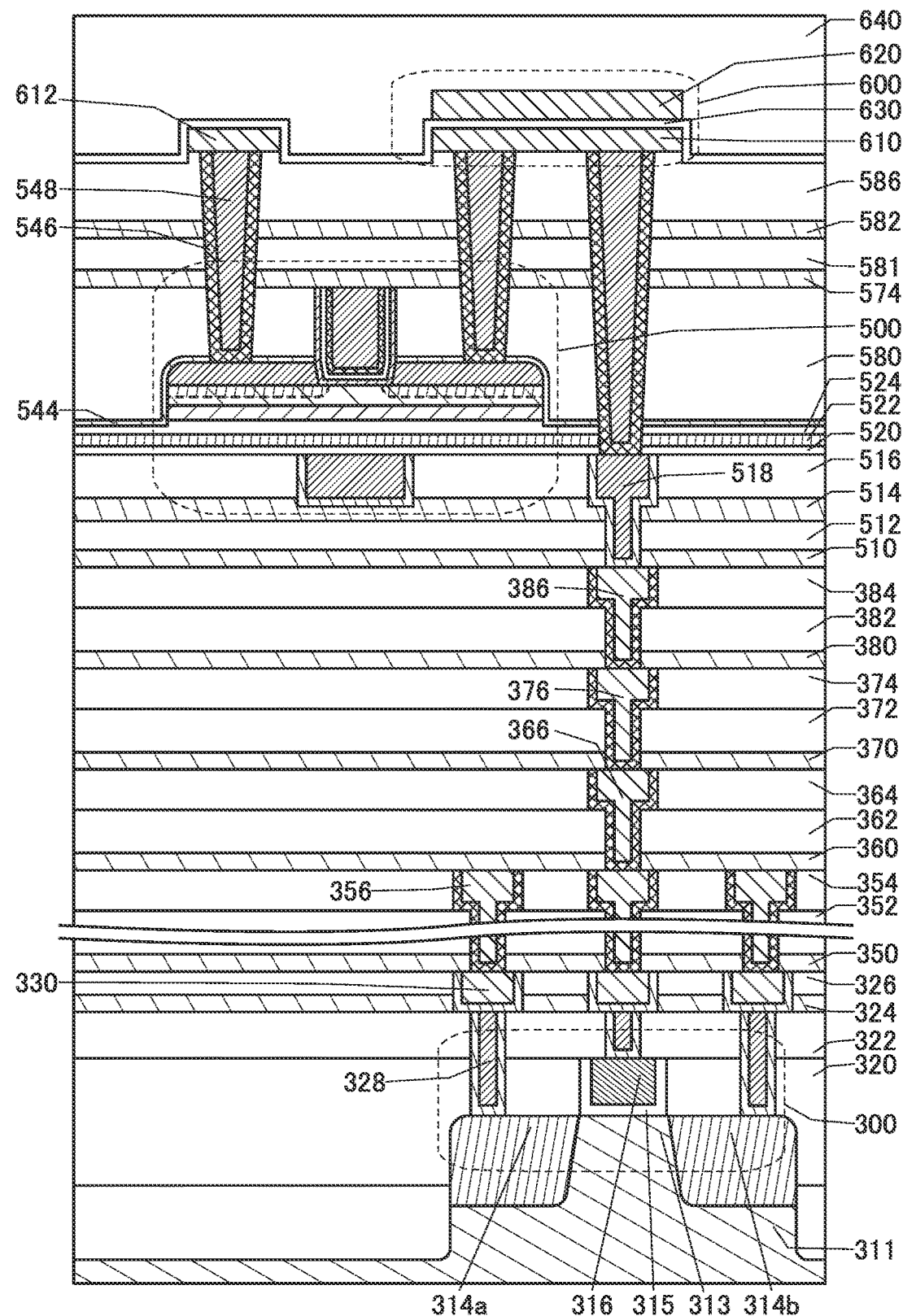
FIG. 12 is a cross-sectional view showing a structure example of a semiconductor device.

A semiconductor device shown in FIG. 12 includes a transistor 300, a transistor 500, and a capacitor 600. FIG.

14(A) is a cross-sectional view of the transistor 500 in the channel length direction. FIG. 14(B) is a cross-sectional view of the transistor 500 in the channel width direction. FIG. 14(C) is a cross-sectional view of the transistor 300 in the channel width direction.

The transistor 500 is a transistor containing a metal oxide in a channel formation region (an OS transistor). Since the of current of the transistor 500 is low, when the transistor 500 is used as an OS transistor included in the semiconductor device, written data can be retained for a long time. In other words, the frequency of refresh operation is low or refresh operation is not required; thus, power consumption of the semiconductor device can be reduced.

The semiconductor device described in this embodiment includes the transistor 300, the transistor 500, and the capacitor 600, as shown in FIG. 12. The transistor 500 is provided above the transistor 300, and the capacitor 600 is provided above the transistor 300 and the transistor 500.

The transistor 300 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as the transistor in the above embodiment, for example.

As shown in FIG. 14(C), in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 13:
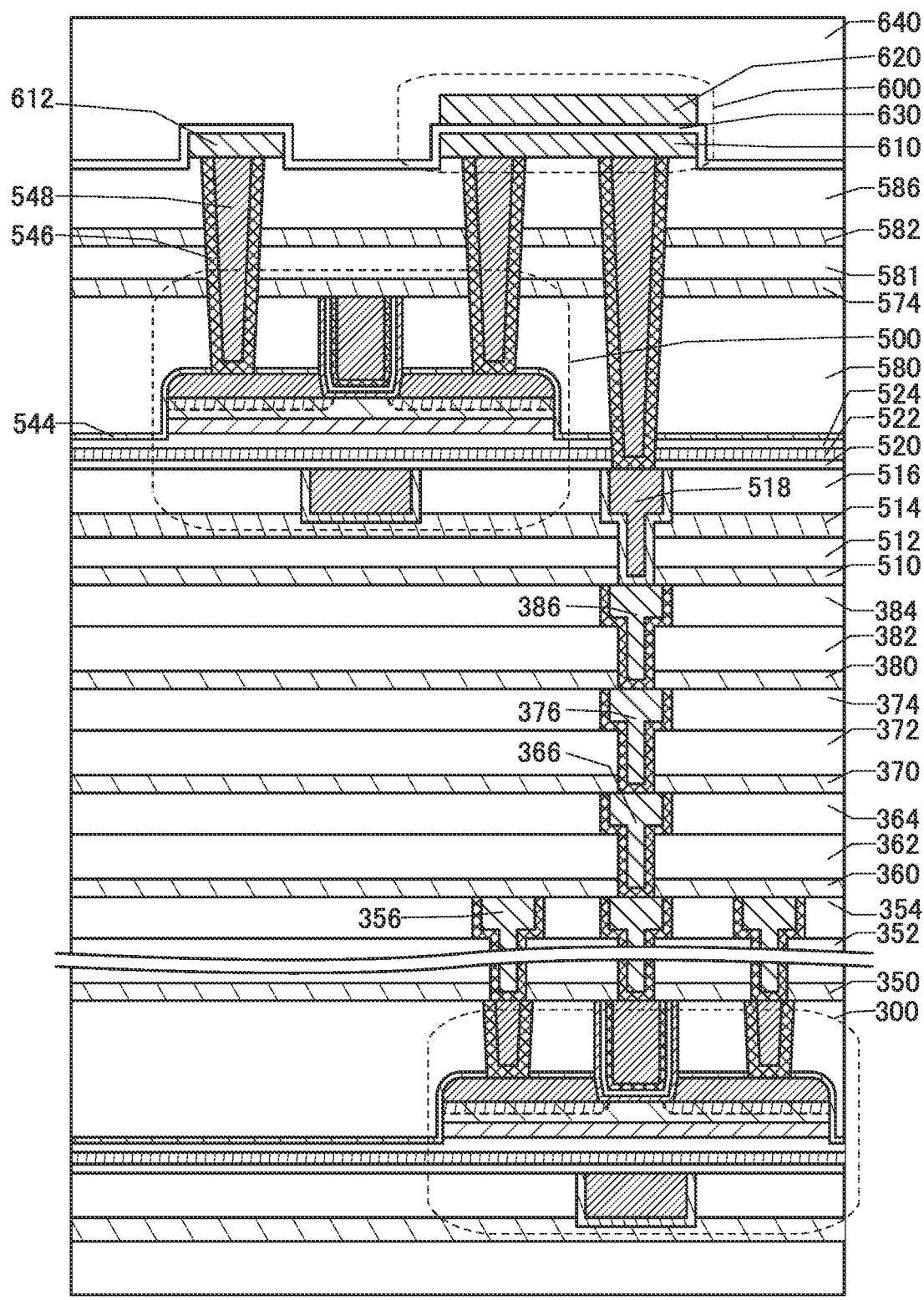
FIG. 13 is a cross-sectional view showing a structure example of a semiconductor device.

Note that the transistor 300 shown in FIG. 12 is an example and the structure is not limited thereto; an appropriate transistor is used in accordance with a circuit configuration or a driving method. For example, when the semiconductor device is a circuit having single polarity that is composed of only OS transistors, the transistor 300 has a structure similar to that of the transistor 500 using an oxide semiconductor, as shown in FIG. 13. Note that the details of the transistor 500 are described later.

An insulator 320, an insulator 322, an insulator 324, and an insulator 326 are stacked sequentially and provided to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 12, an insulator 350, an insulator 352, and an insulator 354 are stacked sequentially and provided. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 12, an insulator 360, an insulator 362, and an insulator 364 are stacked sequentially and provided. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 12, an insulator 370, an insulator 372, and an insulator 374 are stacked sequentially and provided. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 12, an insulator 380, an insulator 382, and an insulator 384 are stacked sequentially and provided. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

Figure 14A:
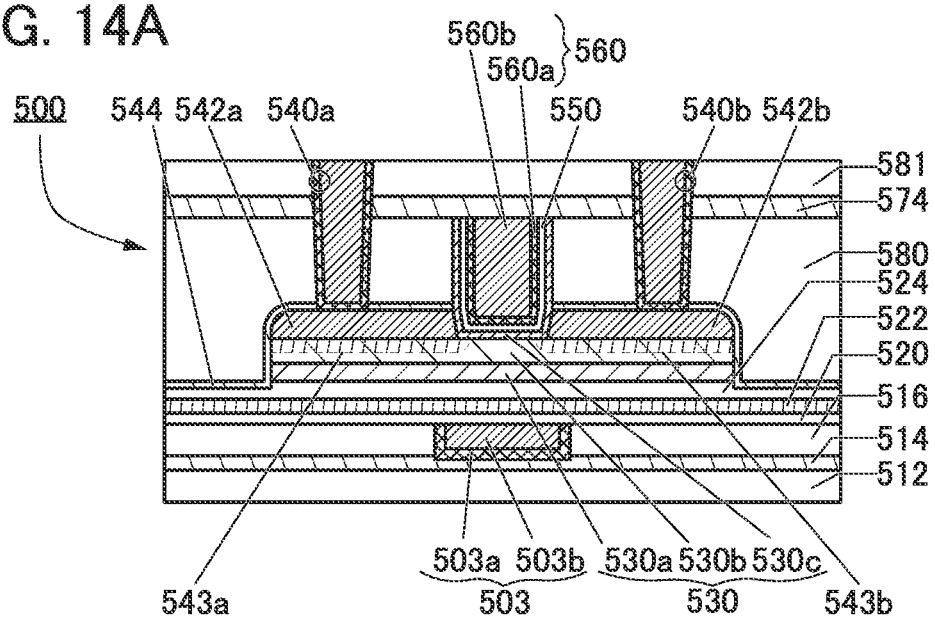
FIGS. 14(A) to 14(C) are cross-sectional views showing structure examples of transistors.
Figure 14B:
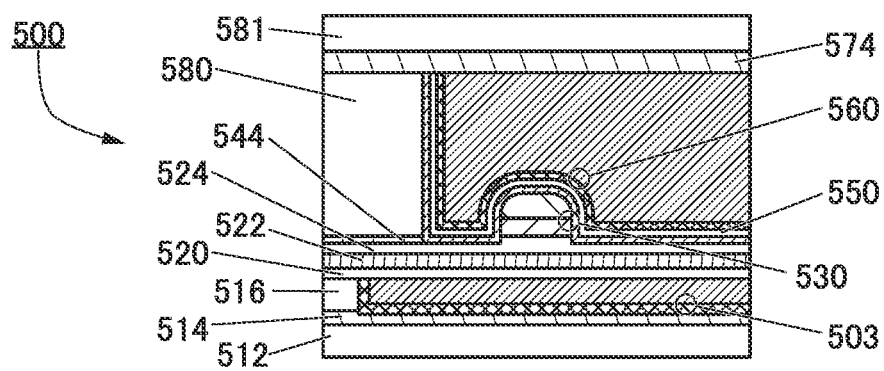
Figure 14C:
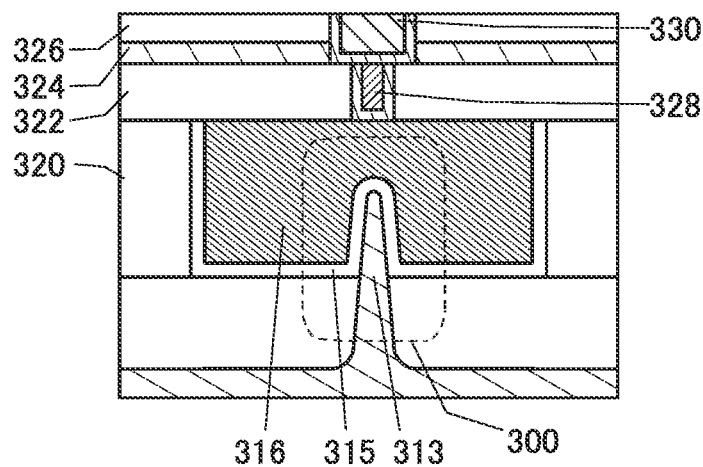

As shown in FIGS. 14(A) and 14(B), the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; an oxide 530*c* positioned on a bottom and a side surface of the opening; an insulator 550 positioned on a formation surface of the oxide 530*c*; and a conductor 560 positioned on a formation surface of the insulator 550.

In addition, as shown in FIGS. 14(A) and 14(B), an insulator 544 is preferably positioned between the insulator 580 and the oxide 530*a*, the oxide 530*b*, the conductor 542*a*, and the conductor 542*b*. Furthermore, as shown in FIGS. 14(A) and 14(B), the conductor 560 preferably includes a conductor 560*a* provided inside the insulator 550 and a conductor 560*b* provided to be embedded inside the conductor 560*a*. Moreover, as shown in FIGS. 14(A) and 14(B), an insulator 574 is preferably positioned over the insulator 580, the conductor 560, and the insulator 550.

Note that in the following description, the oxide 530*a*, the oxide 530*b*, and the oxide 530*c* are sometime collectively referred to as an oxide 530.

Note that although a structure of the transistor 500 in which three layers of the oxide 530*a*, the oxide 530*b*, and the oxide 530*c* are stacked in a region where a channel is formed and its vicinity is shown, the present invention is not limited thereto. For example, a single layer of the oxide 530*b*, a two-layer structure of the oxide 530*b* and the oxide 530*a*, a two-layer structure of the oxide 530*b* and the oxide 530*c*, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 12 and FIG. 14(A) is an example and the structure is not limited thereto; an appropriate transistor is used in accordance with a circuit configuration or a driving method.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, the insulator 524, and the insulator 550 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIGS. 14(A) and 14(B), the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS. Furthermore, as the oxide 530, an In—Ga oxide or an In—Zn oxide may be used.

The metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of oxides that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. Moreover, a metal oxide that can be used as the oxide 530*a* or the oxide 530*b* can be used as the oxide 530*c*.

In addition, the energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*.

Here, the energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To change the energy level gradually, the densities of defect states in mixed layers formed at an interface between the oxide 530*a* and the oxide 530*b* and an interface between the oxide 530*b* and the oxide 530*c* is preferably made low.

Specifically, when the oxide 530*a* and the oxide 530*b* or the oxide 530*b* and the oxide 530*c* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used for the oxide 530*a* and the oxide 530*c*.

At this time, the oxide 530*b* serves as a main carrier path. When the oxide 530*a* and the oxide 530*c* have the above structures, the densities of defect states at the interface between the oxide 530*a* and the oxide 530*b* and the interface between the oxide 530*b* and the oxide 530*c* can be made low. Thus, the influence of interface scattering on carrier conduction is small, and the transistor 500 can have a high on-state current.

The conductor 542*a* and the conductor 542*b* functioning as the source electrode and the drain electrode are provided over the oxide 530*b*. For the conductor 542*a* and conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542*a* and the conductor 542*b* each having a single-layer structure are shown in FIG. 14, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 14(A), a region 543*a* and a region 543*b* are sometimes formed as low-resistance regions at an interface between the oxide 530 and the conductor 542*a* (the conductor 542*b*) and in the vicinity of the interface. In that case, the region 543*a* functions as one of a source region and a drain region, and the region 543*b* functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is shown in FIGS. 14(A) and 14(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in FIG. 12, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a change in electrical characteristics can be inhibited and reliability can be improved in a semiconductor device using a transistor including an oxide semiconductor. Alternatively, a battery management circuit using a transistor including an oxide semiconductor can be miniaturized or highly integrated.

Embodiment 5

In this embodiment, an example n which the battery management circuit described in the above embodiment is used as an electronic component will be described using FIG. 15.

Figure 15A:
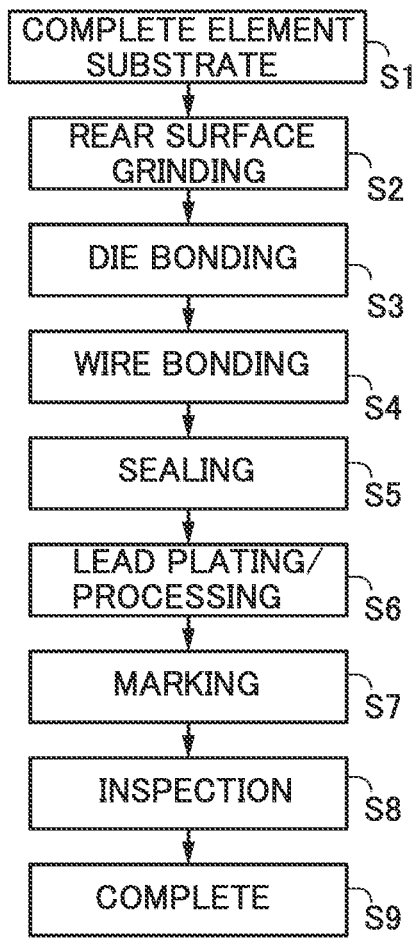
FIGS. 15(A) and 15(B) are a flow chart showing a manufacturing process of an electronic component and a schematic perspective view of the electronic component.

FIG. 15(A) shows an example in which the battery management circuit described in the above embodiment is used as an electronic component. Note that the electronic component is also referred to as a semiconductor package or an IC package. For the electronic component, there are a plurality of standards and names corresponding to a terminal extraction direction and a terminal shape. Thus, examples thereof are described in this embodiment.

A circuit portion including an OS transistor or a Si transistor is completed by integrating a plurality of detachable components on a printed circuit board through an assembly process (a post-process).

The post-process can be completed through steps shown in FIG. 15(A). Specifically, after an element substrate obtained in a pre-process is completed (Step S1), a rear surface of the substrate is ground (Step S2). The substrate is thinned down at this stage, so that warpage or the like of the substrate in the pre-process is reduced and the size of the component is reduced.

The rear surface of the substrate is ground, and a dicing step is performed to divide the substrate into a plurality of chips. Then, a die bonding step of individually picking up the divided chips to be mounted on and bonded to a lead frame is performed (Step S3). To bond the chip and the lead frame in this die bonding step, a method such as bonding with resin or bonding with a tape is selected as appropriate depending on products. Note that in the die bonding step, chips may be mounted on and bonded to an interposer.

Next, wire bonding in which a lead of the lead frame and an electrode on the chip are electrically connected with a metal fine line (wire) is performed (Step S4). A silver line or a gold line can be used as the metal fine line. Furthermore, ball bonding or wedge bonding can be used as the wire bonding.

The wire-bonded chip is subjected to sealing with an epoxy resin or the like in a molding step (Step S5). With the molding step, the inside of the electronic component is filled with resin, so that damage to the circuit portion and the wire embedded by external mechanical force can be reduced, and degradation in characteristics due to moisture or dust can be reduced.

Next, the lead of the lead frame is subjected to plating treatment. Then, the lead is cut and processed (Step S6). This plating treatment prevents corrosion of the lead and enables more reliable soldering at the time of mounting the electronic component on a printed circuit board in a later step.

Next, printing treatment (marking) is performed on a surface of the package (Step S7). Then, through a final inspection step (Step S8), an electronic component that includes a circuit portion including a PLD is completed (Step S9).

Figure 15B:
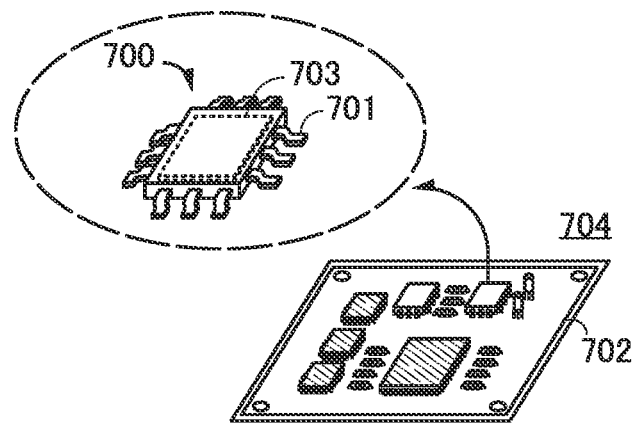

Furthermore, FIG. 15(B) shows a perspective schematic view of the completed electronic component. FIG. 15(B) shows a perspective schematic view of a QFP (Quad Flat Package) as an example of the electronic component. A lead 701 and a circuit portion 703 of an electronic component 700 are shown in FIG. 15(B). The electronic component 700 shown in FIG. 15(B) is mounted on a printed circuit board 702, for example. A plurality of electronic components 700 that are combined and electrically connected to each other over the printed circuit board 702 can be mounted inside an electric device. A completed circuit board 704 is provided in an electric device or the like.

Embodiment 6

The power storage device of one embodiment of the present invention can be used for power supplies of a variety of electric devices that are driven by power.

Specific examples of electric devices each using the power storage device of one embodiment of the present invention include display devices, lighting devices, desktop personal computers, laptop personal computers, image reproduction devices that reproduce still images or moving images stored in recording media such as Blu-ray Discs, cellular phones, smartphones, portable information terminals, portable game machines, e-book readers, video cameras, digital still cameras, high-frequency heating devices such as microwave ovens, electric rice cookers, electric washing machines, air-conditioning systems such as air conditioners, electric refrigerators, electric freezers, electric freezer-refrigerators, freezers for preserving DNA, dialyzers, and the like. In addition, moving objects driven by electric motors using power from power storage devices are also included in the category of electric devices. Examples of the moving objects include electric vehicles, hybrid vehicles each including both an internal-combustion engine and an electric motor, motorized bicycles including motor-assisted bicycles, and the like.

Note that in the electric device, the power storage device of one embodiment of the present invention can be used as a power storage device for covering almost the whole power consumption (referred to as a main power supply). Alternatively, in the electric device, the power storage device of one embodiment of the present invention can be used as a power storage device that can supply power to the electric device when the supply of power from the main power supply or a commercial power supply is stopped (such a power storage device is referred to as an uninterruptible power supply). Alternatively, in the electric device, the power storage device of one embodiment of the present invention can be used as a power storage device for supplying power to the electric device at the same time as the supply of power from the main power supply or a commercial power supply (such a power storage device is referred to as an auxiliary power supply).

Figure 16:
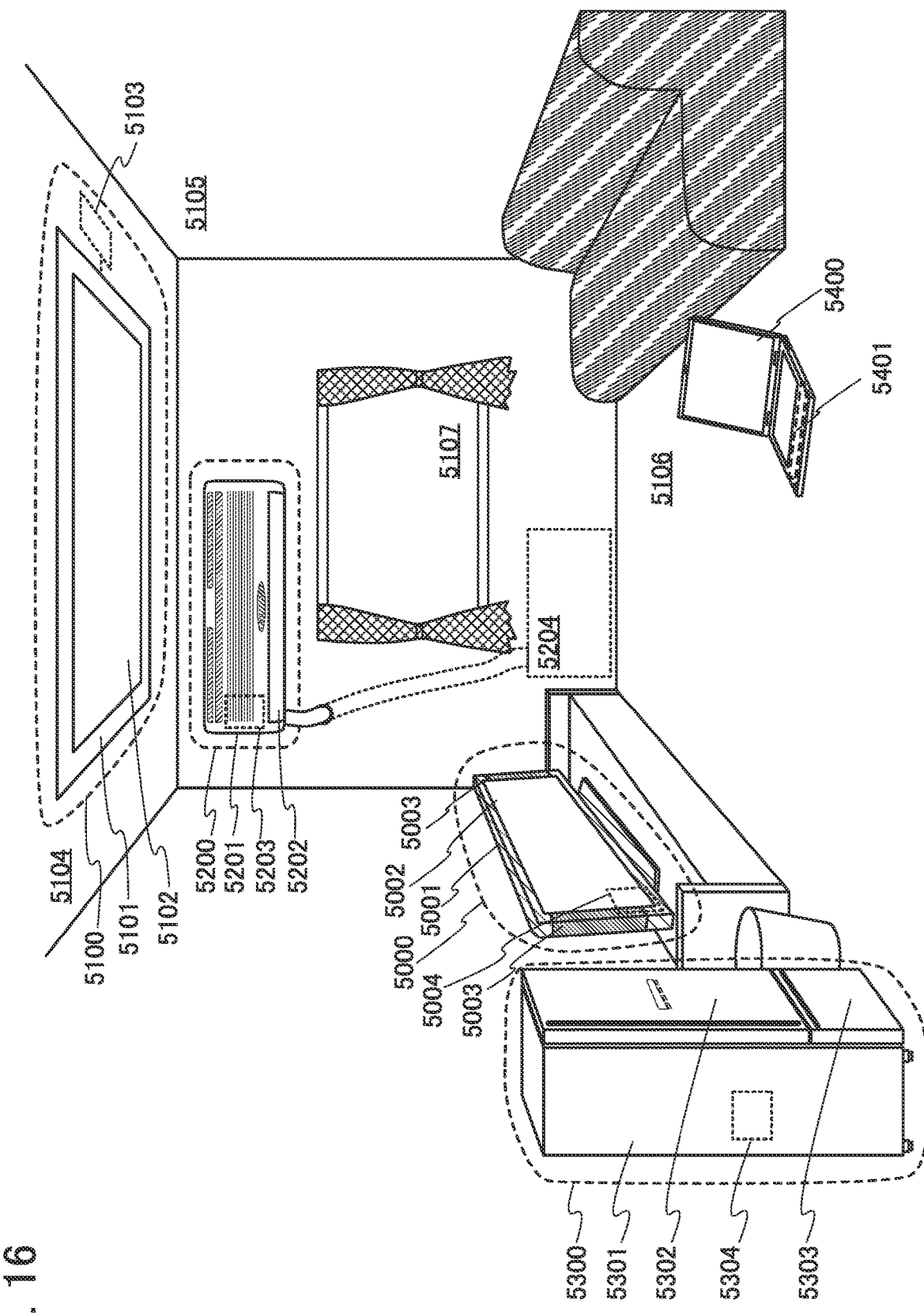
FIG. 16 is a diagram illustrating electric devices of one embodiment of the present invention.

FIG. 16 illustrates specific structures of the electric devices. In FIG. 16, a display device 5000 is an example of an electric device including a power storage device 5004. Specifically, the display device 5000 corresponds to a display device for TV broadcast reception and includes a housing 5001, a display portion 5002, speaker portions 5003, the power storage device 5004, and the like. The power storage device 5004 is provided in the housing 5001. The display device 5000 can receive power from a commercial power supply or can use power accumulated in the power storage device 5004. Thus, the display device 5000 can be utilized with the use of the power storage device 5004 as an uninterruptible power supply even when power cannot be supplied from a commercial power supply due to power failure or the like.

A semiconductor display device such as a liquid crystal display device, a light-emitting device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 5002.

Note that the display device includes all information display devices for personal computers, advertisement displays, and the like besides TV broadcast reception.

In FIG. 16, an installation lighting device 5100 is an example of an electric device using a power storage device 5103. Specifically, the lighting device 5100 includes a housing 5101, a light source 5102, a power storage device 5103, and the like. Although FIG. 16 illustrates the case where the power storage device 5103 is provided in a ceiling 5104 on which the housing 5101 and the light source 5102 are installed, the power storage device 5103 may be provided in the housing 5101. The lighting device 5100 can receive power from a commercial power supply or can use power accumulated in the power storage device 5103. Thus, the lighting device 5100 can be utilized with the use of the power storage device 5103 as an uninterruptible power supply even when power cannot be supplied from a commercial power supply due to power failure or the like.

Note that although the installation lighting device 5100 provided in the ceiling 5104 is illustrated in FIG. 16 as an example, the power storage device of one embodiment of the present invention can be used in an installation lighting device provided in, for example, a wall 5105, a floor 5106, a window 5107, or the like other than the ceiling 5104, or can be used in a tabletop lighting device or the like.

In addition, an artificial light source that obtains light artificially by using power can be used as the light source 5102. Specifically, an incandescent lamp, a discharge lamp such as a fluorescent lamp, and light-emitting elements such as an LED and an organic EL element are given as examples of the artificial light source.

In FIG. 16, an air conditioner including an indoor unit 5200 and an outdoor unit 5204 is an example of an electric device using a power storage device 5203. Specifically, the indoor unit 5200 includes a housing 5201, a ventilation duct 5202, the power storage device 5203, and the like. Although FIG. 16 illustrates the case where the power storage device 5203 is provided in the indoor unit 5200, the power storage device 5203 may be provided in the outdoor unit 5204. Alternatively, the power storage devices 5203 may be provided in both the indoor unit 5200 and the outdoor unit 5204. The air conditioner can receive power from a commercial power supply, or can use power accumulated in the power storage device 5203. In particular, in the case where the power storage devices 5203 are provided in both the indoor unit 5200 and the outdoor unit 5204, the air conditioner can be utilized with the use of the power storage device 5203 of one embodiment of the present invention as an uninterruptible power supply even when power cannot be supplied from a commercial power supply due to power failure or the like.

Note that although the split-type air conditioner including the indoor unit and the outdoor unit is illustrated in FIG. 16 as an example, the power storage device of one embodiment of the present invention can be used in an air conditioner in which one housing has the function of an indoor unit and the function of an outdoor unit.

In FIG. 16, an electric freezer-refrigerator 5300 is an example of an electric device using a power storage device 5304. Specifically, the electric freezer-refrigerator 5300 includes a housing 5301, a refrigerator door 5302, a freezer door 5303, the power storage device 5304, and the like. The power storage device 5304 is provided in the housing 5301 in FIG. 16. The electric freezer-refrigerator 5300 can receive power from a commercial power supply, or can use power accumulated in the power storage device 5304. Thus, the electric freezer-refrigerator 5300 can be utilized with the use of the power storage device 5304 as an uninterruptible power supply even when power cannot be supplied from a commercial power supply due to power failure or the like.

Note that among the electric devices described above, a high-frequency heating devices such as a microwave oven and an electric device such as an electric rice cooker require high power in a short time. The excess of power over the prescribed amount of power of a commercial power supply in use of an electric device can be inhibited by using the power storage device of one embodiment of the present invention as an auxiliary power supply for covering the shortfall in power supplied by the commercial power supply.

In addition, in a time period when electric devices are not used, particularly when the proportion of the amount of power that is actually used to the total amount of power that can be supplied from a commercial power supply source (such a proportion referred to as a usage rate of power) is low, power is accumulated in the power storage device, so that an increase in the usage rate of power can be inhibited in a time period other than the above time period. For example, in the case of the electric freezer-refrigerator 5300, power can be accumulated in the power storage device 5304 in night time when the temperature is low and the refrigerator door 5302 and the freezer door 5303 are not opened and closed. On the other hand, in daytime when the temperature is high and the refrigerator door 5302 and the freezer door 5303 are opened and closed, the power storage device 5304 is used as an auxiliary power supply; thus, the usage rate of power in daytime can be reduced.

In FIG. 16, a laptop personal computer 5400 is an example of an electric device using a power storage device 5401. The power storage device 5401 is provided in a housing in FIG. 16. The laptop personal computer 5400 can receive power from a commercial power supply or can use power accumulated in the power storage device 5401. Thus, the laptop personal computer 5400 can be utilized with the use of the power storage device 5401 as an uninterruptible power supply even when power cannot be supplied from a commercial power supply due to power failure or the like.

Next, a portable information terminal that is an example of an electric device provided with the power storage device of one embodiment of the present invention will be described.

Figure 17A:
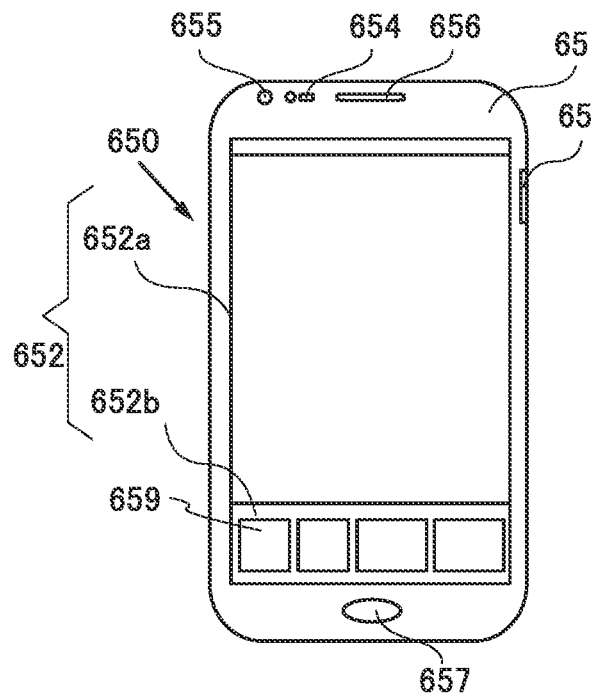
FIGS. 17(A) to 17(C) are diagrams illustrating an electric device of one embodiment of the present invention.
Figure 17B:
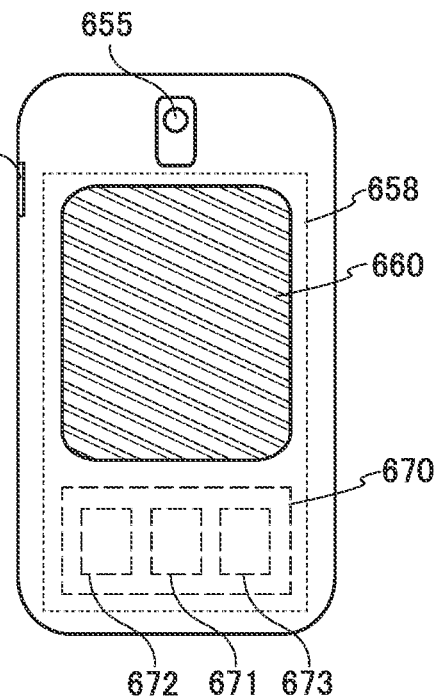

FIG. 17(A) is a schematic diagram of a front side of a portable information terminal 650. FIG. 17(B) is a schematic diagram of a back side of the portable information terminal 650. The portable information terminal 650 includes a housing 651, a display portion 652 (including a display portion 652a and a display portion 652b), a power button 653, an optical sensor 654, a camera lens 655, a speaker 656, a microphone 657, and a power source 658.

The display portion 652a and the display portion 652b are touch panels, and keyboard buttons for inputting text can be displayed as needed. When the keyboard button is touched with a finger, a stylus, or the like, text can be input. Alternatively, when text is directly written or an illustration is directly drawn in the display portion 652a with a finger, a stylus, or the like without displaying the keyboard buttons, the text or the illustration can be displayed on the display portion 652a.

In addition, in the display portion 652b, functions that can be performed by the portable information terminal 650 are displayed. When a marker indicating a desired function is touched with a finger or a stylus, the portable information terminal 650 performs the function. For example, when a marker 659 is touched, the portable information terminal 650 can perform the function of a phone; thus, phone conversation using the speaker 656 and the microphone 657 is possible.

The portable information terminal 650 incorporates a detection device (not illustrated) that detects inclination, such as a gyroscope sensor or an acceleration sensor. Thus, when the housing 651 is placed vertically or horizontally, the display orientation can be changed to vertical display, horizontal display, or the like in the display portion 652a and the display portion 652b.

Furthermore, the portable information terminal 650 is provided with the optical sensor 654; thus, in the portable information terminal 650, the luminance of the display portion 652a and the display portion 652b can be optimally controlled in accordance with the amount of external light detected with the optical sensor 654.

The portable information terminal 650 is provided with the power source 658, and the power source 658 includes a solar cell 660 and a charge/discharge control circuit 670. Note that in FIG. 17(C), a structure including a battery 671, a DC/DC converter 672, and a converter 673 is illustrated as an example of the charge/discharge control circuit 670, and the battery 671 includes the power storage device described in the above embodiment.

In addition, the portable information terminal 650 can also have a function of displaying various kinds of data (a still image, a moving image, a text image, and the like), a function of displaying a calendar, a date, time, or the like on the display portion, a touch-input function of operating or editing data displayed on the display portion by touch input, a function of controlling processing by a variety of software (programs), and the like.

With the solar cell 660 that is attached to the portable information terminal 650, power can be supplied to the display portion, a video signal processing portion, and the like. Note that the solar cell 660 can be provided on one surface or both surfaces of the housing 651, and it is possible to employ a structure where the battery 671 is charged efficiently. Note that the use of the power storage device of one embodiment of the present invention as the battery 671 has advantages such as a reduction in size.

Figure 17C:
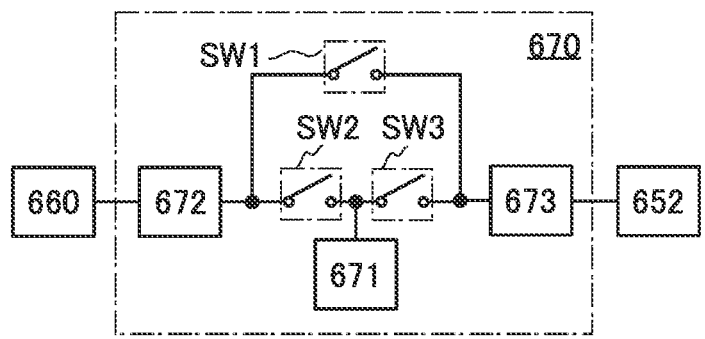

In addition, the structure and operation of the charge/discharge control circuit 670 shown in FIG. 17(B) will be described using a block diagram shown in FIG. 17(C). FIG. 17(C) shows the solar cell 660, the battery 671, the DC/DC converter 672, the converter 673, switches SW1 to SW3, and the display portion 652. The battery 671, the DC/DC converter 672, the converter 673, and the switches SW1 to SW3 are portions that correspond to the charge/discharge control circuit 670 shown in FIG. 17(B).

First, an operation example when power is generated by the solar cell 660 using external light is described. The voltage of power generated by the solar cell 660 is raised or lowered by the DC/DC converter 672 to be a voltage for charging the battery 671. Then, when the power from the solar cell 660 is used for the operation of the display portion 652, the switch SW1 is turned on and the voltage of the power is raised or lowered by the converter 673 to be a voltage needed for the display portion 652. In addition, when display on the display portion 652 is not performed, a structure is employed in which SW1 is turned off and SW2 is turned on so that the battery 671 is charged.

Note that although the solar cell 660 is described as an example of a power generation means, there is no particular limitation on the power generation means. A structure may be employed in which the battery 671 is charged using another power generation means such as a piezoelectric element or a thermoelectric conversion element (a Peltier element). For example, a structure may be employed in which the battery 671 is charged with a non-contact power transmission module that transmits and receives power wirelessly (without contact) for charging, or with a combination of another charging means.

Figure 18:
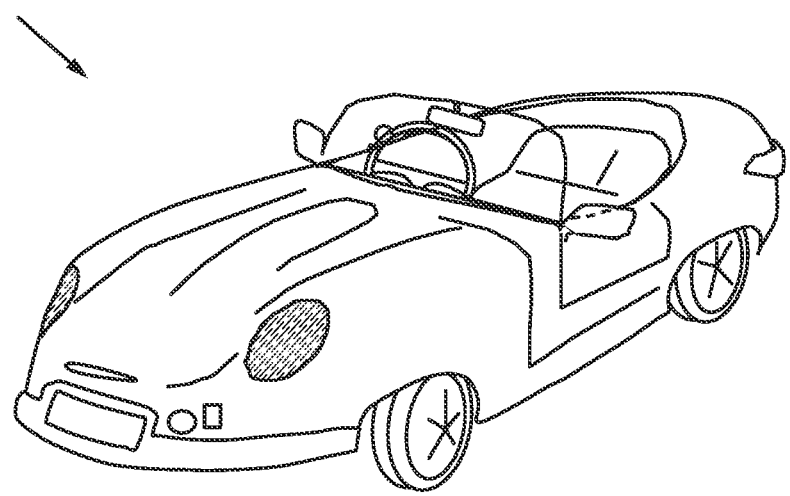
FIG. 18 is a diagram illustrating an electric device of one embodiment of the present invention.
Figure 18:
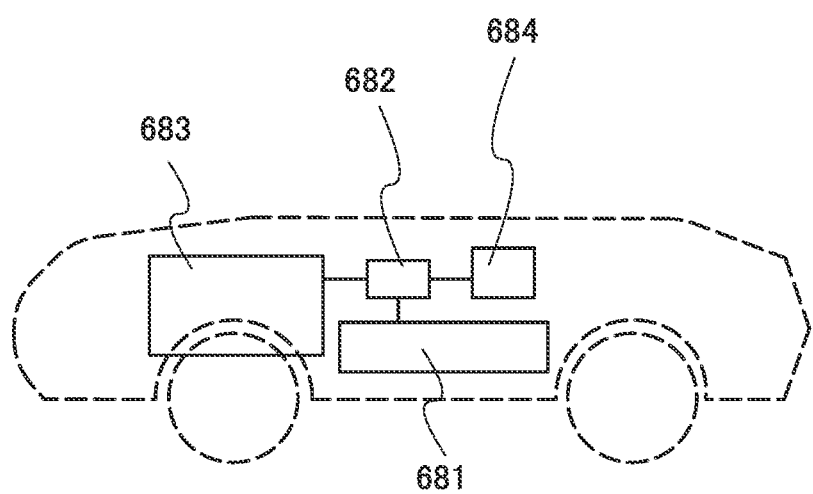

Furthermore, an example of the moving object that is an example of the electric device is described using FIG. 18.

The power storage device described in the above embodiment can be used as a battery for the moving object. The battery for the moving object can be charged by power supply from the outside using a plug-in technique or contactless power feeding. Note that in the case where the moving object is an electric railway vehicle, the electric railway vehicle can be charged by power supply from an overhead cable or a conductor rail.

FIG. 18 illustrates an example of an electric vehicle. An electric vehicle 680 is equipped with a battery 681. The output of the power of the battery 681 is adjusted by a control circuit 682, and the power is supplied to a driving device 683. The control circuit 682 is controlled by a processing unit 684 including a ROM, a RAM, a CPU, or the like that is not illustrated.

The driving device 683 is composed of a DC motor or an AC motor either alone, or a combination of a motor and an internal-combustion engine. The processing unit 684 outputs a control signal to the control circuit 682 on the basis of input data such as data on operation (acceleration, deceleration, stop, or the like) by a driver of the electric vehicle 680 or data during driving (data on an uphill, a downhill, or the like, data on a load on a driving wheel, or the like). The control circuit 682 adjusts electrical energy supplied from the battery 681 in accordance with the control signal of the processing unit 684 to control the output of the driving device 683. In the case where the AC motor is mounted, although not illustrated, an inverter that converts direct current into alternate current is also incorporated.

The battery 681 can be charged by power supply from the outside using a plug-in technique. For example, the battery 681 is charged through a power plug from a commercial power source. The battery 681 can be charged by converting power into a DC constant voltage having a constant voltage value through a converter such as an AC/DC converter. Incorporating the power storage device of one embodiment of the present invention as the battery 681 can contribute to an increase in the capacity of the battery or the like, so that convenience can be improved. In addition, when the battery 681 itself can be made compact and lightweight as a result of the improvement of the characteristics of the battery 681, it contributes to a reduction in the weight of the vehicle, and thus fuel efficiency can be improved.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" includes the case where electric signals can be transmitted and received between A and B when an object having any electric action exists between A and B.

REFERENCE NUMERALS

100: power storage device, 110: battery management circuit, 111: voltage monitor circuit, 112: current monitor circuit, 113: arithmetic unit, 114: terminal 120: assembled battery cell, and 121: battery cell.

The invention claimed is:

1. A battery management circuit of a battery cell comprising:
a voltage monitor circuit,
wherein the voltage monitor circuit includes a multiplexer and a buffer circuit for outputting a signal for controlling the multiplexer,
wherein the multiplexer and the buffer circuit each include an n-channel transistor, and
wherein the n-channel transistor is a transistor including an oxide semiconductor in a channel formation region.

2. The battery management circuit according to claim 1, wherein the multiplexer is configured to retain an output voltage of the battery cell by setting the transistor in an off state.

3. The battery management circuit according to claim 1, further comprising an arithmetic processing circuit for performing arithmetic processing utilizing a Kalman filter.

4. A power storage device comprising:
a plurality of battery cells connected in series; and
a battery management circuit,
wherein the battery management circuit includes a voltage monitor circuit configured to acquire a voltage value between a pair of electrodes of any one of the battery cells, wherein the voltage monitor circuit includes a multiplexer and a buffer circuit for outputting a signal for controlling the multiplexer, wherein the multiplexer and the buffer circuit each include an n-channel transistor, and wherein the n-channel transistor is a transistor including an oxide semiconductor in a channel formation region.

5. The power storage device according to claim 4, wherein the multiplexer is configured to retain an output voltage of the battery cell by setting the transistor in an off state.

6. The power storage device according to claim 4, wherein the battery management circuit includes an arithmetic processing circuit for performing arithmetic processing utilizing a Kalman filter.

7. An electric device comprising:

the power storage device according to claim 4, and a display portion.

* * * * *